(12) United States Patent
Yoshida et al.

(10) Patent No.: US 6,271,589 B1
(45) Date of Patent: Aug. 7, 2001

(54) THICK-FILM CONDUCTOR CIRCUIT AND PRODUCTION METHOD THEREFOR

(75) Inventors: Kozo Yoshida; Kenichi Sakabe, both of Shizuoka (JP)

(73) Assignee: Asahi Kasei Kabushiki Kaisha, Osaka (JP)

(*) Notice: Subject to any disclaimer, the term of this patent is extended or adjusted under 35 U.S.C. 154(b) by 0 days.

(21) Appl. No.: 09/202,958
(22) PCT Filed: Jun. 27, 1996
(86) PCT No.: PCT/JP96/01789
§ 371 Date: Dec. 24, 1998
§ 102(e) Date: Dec. 24, 1998
(87) PCT Pub. No.: WO97/50280
PCT Pub. Date: Dec. 31, 1997
(51) Int. Cl.[7] .................................................. H01L 23/48
(52) U.S. Cl. ......................... 257/741; 257/762; 257/775
(58) Field of Search ................... 29/602.1, 43; 336/200, 336/223, 232; 257/762, 775, 741, 923; 174/115, 126.2

(56) References Cited

U.S. PATENT DOCUMENTS 5,955,785 * 9/1999 Gardner et al. ...................... 257/751

FOREIGN PATENT DOCUMENTS

| 59-55245 | 3/1984 | (JP) . |
| 60-101993 | 6/1985 | (JP) . |
| 4-5277 | 1/1992 | (JP) . |

* cited by examiner

*Primary Examiner*—Anh Mai
(74) *Attorney, Agent, or Firm*—Finnegan, Henderson, Farabow, Garrett & Dunner, L.L.P.

(57) ABSTRACT

A method for manufacturing a thick-film conductor circuit. The method of manufacture comprises: employing a conductive substrate which is an aluminum plate processed with basic solution containing zinc; coating the surface of the conductive substrate with a liquid photosensitive resin composition; exposing a portion, in which a resin pattern must be formed, to a high-energy beam; dissolving or dispersion-removing a non-exposed portion of the photosensitive resin composition with developing solution so that a required resin pattern is formed on the conductive substrate; immersing the conductive substrate in plating solution while voltage is applied so that a conductor is formed by electrolytic plating; and removing the conductive substrate.

10 Claims, 3 Drawing Sheets

THICK-FILM CONDUCTOR CIRCUIT AND PRODUCTION METHOD THEREFOR

TECHNICAL FIELD

The present invention relates to a thick-film conductor circuit for use in an industrial field of electronic elements or circuit elements, the sizes of which have furthermore been reduced and functions of which have been increased to manufacture a coil for a very small, high-performance, compact and flat motor, a precise coil for an optical pickup for reading high-speed data from a compact disk, an MD or a DVD, a circuit substrate including a precise wiring portion for an LSI or a circuit element for connecting a display device which has furthermore precisely been formed into a device, and to a manufacturing method therefor. More particularly, the present invention relates to a reliable thick-film conductor circuit including a portion, in which a shortest wiring pitch is shorter than 100 μm and which enables resistance can densely and freely be set, and a manufacturing method therefor.

BACKGROUND ART

The dense, low-resistance and reliable thick-film conductor circuit must have a short wiring pitch and incorporate a conductor having a large cross sectional area, that is, having a large height and satisfactory chemical stability, for example, acid resistance and corrosion resistance.

For example, the number of pins in each of IC and LSI (Large Scale Integrated Circuit), the performance of each of which has been improved in recent years, has been enlarged to meet a requirement for realizing improved performance. Moreover, the pitch of the pins has gradually been shortened. Liquid crystal display units have been required to have precise structures. Under the foregoing circumstances, the number of display scanning lines has significantly be enlarged. Moreover, intervals of electric wires have been excessively shortened to easily mount ICs for controlling display. Under the above-mentioned technological circumstances, there arises a requirement for a dense and low-resistance element for connecting different-pitch wiring elements to each other such that elements having considerably different wiring pitches, for example, an IC or an LSI having pins configured at small pitches and a mother board (having electric wires configured at long pitches owning to a manufacturing requirement) are connected to each other. Note that an element of the foregoing type is defined as an "interposer" in a document (Nikkei Electronics, 1995. 1. 16 (No. 626) pp. 79 to 86). In this specification, the foregoing element is defined as a "different=pitch-element connecting member". As for performance which must be satisfied by the different-pitch-element connecting member, a report has been published in 6-th Microelectronic Symposium, pp. 43 to 46 about a fact that signal pulses are attenuated in inverse proportion to the resistance of the wiring when the CPU is operated at clock speed for a high speed operation. If the resistance of the wiring for connecting a control IC for a precise liquid crystal display device and a liquid crystal substrate is raised, the S/N ratio is lowered and thus the image becomes instable. As a result, the different-pitch-element connecting member must have a low-resistance circuit, short wiring pitches and satisfactory reliability.

As a means for improving the chemical stability of a conductor, plating of zinc, which has a base standard potential as compared with that of copper, on the surface of copper has been performed to prevent corrosion of the copper. However, the zinc plating method encounters a fact that the physical properties of a formed film are adversely affected by the plating conditions, that is, the composition of plating solution, the density of contained impurities, temperatures during a plating process and the density of electric currents. Therefore, the plating solution and process must delicately be controlled. A zinc film must have a large thickness to obtain the corrosion resistance. If the thickness and ratio of zinc having inferior electric conductivity to that of copper are enlarged, there arises a problem in that the electric conductivity deteriorates. Since a process using high frequencies encounters a problem in that the resistance of the surface of the conductor is raised, the surfaces of the conductor is sometimes plated with a noble metal, such as gold. However, a means cannot be obtained which is capable of reducing the thickness of a zinc film, maintaining the electric conductivity and preventing corrosion and oxidation of a copper pattern, which is an object of the present invention and which is applicable to a dense conductor circuit having a large surface area with respect to the cross sectional area of the conductor.

As a method of manufacturing a dense and thick-film conductor circuit, a method is known in which a copper-applied substrate, photolithography and etching are combined with one another. However, a thick-film conductor circuit obtainable from the above-mentioned method encounters difficulty to prevent a side etching phenomenon which takes place when copper foil is etched. If the density is raised, the reliability of the conductor deteriorates. In proportion to the height of the conductor, the above-mentioned phenomenon becomes critical. Therefore, the thickness of copper foil of usual copper-applied substrates is about 18 μm to 35 μm. Also the wiring density is lower than 20 lines/mm.

Another method of manufacturing a thick-film conductor circuit, methods have been disclosed in Japanese Patent Laid-Open No. 52-137666 and Japanese Patent Laid-Open No. 57-162489, in which a resin pattern is filled with a thick-film paste material. Another method is disclosed in Japanese Patent Laid-Open No. 55-41729, in which thick-film paste and a positive-type resist are mixed with each other, after which exposure and development are performed. However, the above-mentioned methods cause a thick-film conductor circuit to be obtained in which voids are formed in the conductor, a defect takes place owning to short circuit between conductors and the characteristics of the circuit deteriorate because of rise in the resistance of the conductor.

In Japanese Patent Laid-Open No. 59-198792, a method of manufacturing a thick-film conductor circuit has been disclosed which has the steps of: repeating lamination and exposure of photosensitive resin such that a conductive substrate is employed as a base, and performing development and electric plating. Although expectation can be made that the above-mentioned method will enable a resist pattern having a relatively high aspect ratio to be obtained and a low-resistance conductor circuit to be manufactured, a complicated process must be performed. What is worse, the deviation which occurs when the lamination and exposure are performed causes a defect to be introduced and short circuit to occur because of a defective resin change. Thus, there arises a multiplicity of problems in that the reliability of the circuit is unsatisfactory.

In Japanese Patent Laid-Open No. 56-94690 and Japanese Patent Laid-Open No. 60-161605, methods each of is capable of forming a fine pattern circuit have been disclosed, in each of which a conductive substrate and photolithography are combined with each other after which anisotropic electrolytic plating is performed. The foregoing method controls the design of the conductor by the plating start width. What is worse, the conductor has a spherical shape. Therefore, the above-mentioned method is unsatisfactory as a method of manufacturing a dense and low-resistance pattern conductor.

Moreover, the applicant of the present invention has disclosed, in Japanese Patent Laid-Open No. 6-260740, a method of processing a substrate for the purpose of obtaining a resist pattern having a high aspect ratio by improving the adhesiveness between photosensitive resin and conductive substrate. However, a thick-film conductor circuit obtainable from the above-mentioned method cannot include a predetermined layer containing zinc atoms in a surface layer of the conductor. Thus, there arises a somewhat problem in that satisfactory oxidation resistance cannot be obtained.

In contrast to the above-mentioned printed circuit industrial field, significant developments have been made in a micro-machine field including a medical field and a sensor technology field. As an example of application of a method of manufacturing a micro-machine to a process for manufacturing a pattern conductor, methods of manufacturing microcoils have been suggested in Microelectronic Engineering 4 (1986), 35 and Proc. IEEE Solid-State Sensor & Actuator Workshop June (1988) P1, in each of which X-ray lithography (a LIGA process) is performed such that PMMA resist and synchrotron radiated light are combined with each other. The above-mentioned method enables a significantly dense, low-resistance and thick-film pattern conductor to be manufactured. However, a costly X-ray source inhibits cost reduction. Moreover, the sizes of substrates which can be employed are limited. Thus, there arises a problem in that the industrial manufacturing process cannot easily be performed.

In place of the LIGA process, fine pattern forming techniques each using photosensitive polyimide have been disclosed in Transducers '93, Yokohama, June (1993), 7th Int. Con. Solid-State Sensor & Actuator and so forth. The above-mentioned techniques are techniques for applying photolithography and plating to the surface of a silicon substrate so as to form a micro-gear or a comb electrode. However, a technique for industrially and less-expensively manufacturing a dense and low-resistance conductor pattern has not been disclosed.

In contrast to the above-mentioned techniques each of which is capable of forming a fine pattern conductor, the applicant of the present invention has disclosed a method of manufacturing a thick-film fine pattern having a high aspect ratio in Japanese Patent Publication No. 5-81897. Moreover, the applicant has disclosed liquid photosensitive resin having improved adhesiveness with a conductive substrate in Japanese Patent Laid-Open No. 6-283830. However, the photosensitive resin composition as disclosed above has a problem in that residues are somewhat left in non-exposed portions of the photosensitive resin composition in the lithography process.

The difference between a photosensitive resin composition according to the present invention and the photosensitive resin composition disclosed in Japanese Patent Publication No. 5-81897 will now be described. The characteristic of the photosensitive resin composition according to the present invention lies in that the light transmittance of the photosensitive resin composition is controlled. In contrast to the photosensitive resin composition disclosed in Japanese Patent Publication No. 5-81897 in which only a polymerization initiator controls exposure, the method according to the present invention has a structure that both of a polymerization initiator and a photoabsorber are used to control the light transmittance.

For example, a photosensitive resin composition having a light transmittance of 70% enables a resist pattern to be manufactured in either of a case where only the polymerization initiator is used or a case where both of the polymerization initiator and the photoabsorber are used. However, when only the polymerization initiator is used in a large quantity, the resolution and development characteristic deteriorate excessively. If a dense pattern of 100 $\mu$m or finer is formed, there arises problems of residues and fogging. If both of the polymerization initiator and the photoabsorber are used, photopolymerization reactions which take place when exposure is performed can be controlled. Simultaneously, light transmission can be adjusted. Therefore, a very dense pattern of 100 $\mu$m or finer can be formed. When the combination of the photoabsorber and the photoabsorber to obtain effects of preventing residues in the development process and fogging is employed, the photoabsorber must prevent light transmittance in a quantity of 15% or greater.

FIG. 5 shows the relationship between thicknesses and light transmittance of the photosensitive resin composition according to the present invention and the photosensitive resin composition disclosed in the embodiment of Japanese Patent Publication No. 5-81897. As can be understood from FIG. 5, the photosensitive resin composition disclosed in Japanese Patent Publication No. 5-81897 having light transmittance which is higher than that of the photosensitive resin composition according to the present invention enables a resist pattern having a large thickness to be formed. However, a dense pattern of 100 $\mu$m or finer cannot be obtained. The photosensitive resin composition disclosed in Japanese Patent Publication No. 5-81897 encounters reduction in the light transmittance of 75% or lower if the thickness of the formed film is enlarged. Also in this case, non-exposed portions encounter residues and fogging.

The present invention and Japanese Patent Publication No. 5-81897 are different from each other in prepolymer. That is, the present invention has a structure that a compound having components expressed by the following chemical formulas (1) and (2) is employed in addition to dicarboxylic acid which is a raw material of the prepolymer. Thus, a photosensitive resin composition simultaneously having unexpected high resolution, a satisfactory development characteristic and plating resistance was found. Moreover, when a compound having a component expressed by the following chemical formula (3) is blended at a specific ratio, the foregoing effect can furthermore be improved.

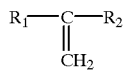

Chemical Formula (1)

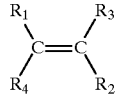

Chemical Formula (2)

where $R_1$ and $R_2$ are each —COOH or —CH$_2$COOH and $R_3$ and $R_4$ are each —H or —CH$_3$.

HOOC—(CH$_2$)n–COOH (n=3 to 8)      Chemical Formula (3)

Since the photosensitive resin composition according to the present invention contains the relatively reactive prepolymer, the reservation stability for a long time is inferior to that of another prepolymer. Therefore, employment of the foregoing photosensitive resin composition has not been considered. However, a fact that the foregoing resin is significantly advantageous resin as photosensitive resin for forming a thick-film conductor circuit was found.

DISCLOSURE OF THE INVENTION

In consideration of the above-mentioned technical trend, the inventors of the present invention has detected a method of improving the chemical stability of a conductor circuit. The method is characterized by proving a layer containing zinc for a position near the surface of the conductor. Thus, oxidation resistance of the surface portion of the conductor can significantly be improved and rise in the resistance of the conductor can be prevented. Thus, the present invention has been established. The present invention has the following characteristics.

1. A thick-film conductor circuit comprising: a zinc-contained layer which is formed in a region of a depth of 5 $\mu$m from a surface of a conductor composed of copper and which contains zinc atoms at a ratio of 3 atom % to 20 atom % with respect to copper atoms, wherein a thickness of the zinc-contained layer of 0.1 $\mu$m of 5 $\mu$m.

2. A thick-film conductor circuit according to claim 1, wherein the conductor has a rectangular widthwise directional cross sectional shape and rounded corners are provided for two lower ends of the conductor.

3. A thick-film conductor circuit comprising a conductor which has a rectangular widthwise directional cross sectional shape, wherein rounded corners are provided for two lower ends of the conductor.

4. A thick-film conductor circuit according to any one of claims 1 to 3, wherein the conductor has a portion in which a minimum wiring pitch is 100 $\mu$m or shorter, the aspect ratio of the conductor is 1.2 or higher and the height of the conductor is 20 $\mu$m or larger.

5. A method of manufacturing a thick-film conductor circuit comprising the steps of: employing a conductive substrate which is an aluminum plate processed with basic solution containing zinc; coating the surface of the conductive substrate with a liquid photosensitive resin composition; exposing a portion, in which a resin pattern must be formed, to a high-energy beam; dissolving or dispersion-removing a non-exposed portion of the photosensitive resin composition with developing solution so that a required resin pattern is formed on the conductive substrate; immersing the conductive substrate in plating solution while voltage is applied so that a conductor is formed by electrolytic plating; and removing the conductive substrate.

6. A method of manufacturing a thick=film conductor circuit comprising the steps of: coating the surface of a conductive substrate with a liquid photosensitive resin composition; exposing a portion, in which a resin pattern must be formed, to a high-energy beam; dissolving or dispersion-removing a non-exposed portion of the photosensitive resin composition with developing solution so that a required resin pattern is formed on the conductive substrate; forming a conductor by electrolytic plating; and removing the conductive substrate, wherein the liquid photosensitive resin composition contains prepolymer having an ethylene unsaturated group, polymerizable monomer, a light polymerization initiator and a photoabsorber, the prepolymer is unsaturated polyester resin which is obtainable from condensation of a dicarboxylic acid component and a diol component and which has a number average molecular weight of 500 to 5,000, the dicarboxylic acid component contains compound (a) having a component expressed by the following chemical formula (1) at a molar ratio of 0.1 to 0.4 and compound (b) having a component expressed by the following chemical formula (2) at a molar ratio of 0.1 to 0.4 when the overall molar ratio of the dicarboxylic acid component is 1:

chemical formula (1)

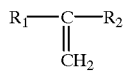

chemical formula (2)

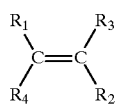

where $R_1$ and $R_2$ are each —COOH or —CH$_2$COOH and $R_3$ and $R_4$ are each —H or —CH$_3$, the polymerizable monomer component contains at least one type of a compound which has at least three acryloyl groups or methacryloyl groups in one molecule and which is combined with carbon atoms to which the aclyloyl group or the methacryoyl group is combined such that fifteen or less carbon atoms and/or oxygen atoms exist in such a manner that the compound is contained by 1 part by weight to 3 parts by weight with respect to 100 parts by weight of the prepolymer, a light polymerization initiator having a molar absorbance coefficient of 5 l/mol·cm to 1000 l/mol·cm is contained in a quantity of 0.1 wt % to 10 wt %, and the light transmittance is 15% to 75%.

7. A method of manufacturing a thick-film conductor circuit according to claim 6, wherein the conductive substrate is an aluminum plate processed with basic solution containing zinc.

8. A method of manufacturing a thick-film conductor circuit according to claim 6, wherein 75 mol % or more of components except for the components expressed by chemical formula (1) and chemical formula (2) is dicarboxylic acid component expressed by the following chemical formula (3):

HOOC—(CH$_2$)n—COOH (n=3 to 8)  chemical formula 3

9. A method of manufacturing a thick-film conductor circuit according to claim 7, wherein 75 mol % or more of components except for the components expressed by chemical formula (1) and chemical formula (2) is dicarboxylic acid component expressed by the following chemical formula (3):

HOOC—(CH$_2$)n—COOH (n=3 to 8)  chemical formula 3

10. A thick-film conductor circuit according to any one of claims 2 to 4, wherein an insulating lithography between conductors is a hardened material of the photosensitive resin composition claimed in claim 6.

11. A method of manufacturing a thick-film conductor circuit according to claim 6, wherein the surface diffusion reflectance of the conductive substrate in a photosensitive wavelength region of the liquid photosensitive resin is 20% or lower.

12. A method of manufacturing a thick-film conductor circuit according to claim 7, wherein the surface diffusion reflectance of the conductive substrate in a photosensitive wavelength region of the liquid photosensitive resin is 20% or lower.

13 A flat oil comprising: coil patterns each having a conductor formed into a rectangular cross sectional shape and disposed opposite to each other; and a through hole for causing the upper and lower surfaces to communicate with each other, wherein the coil conductor is the thick-film conductor claimed in any one of claims 1 to 4.

14. A different-pitch wiring element for use in a wiring circuit for connecting elements having different wiring pitches to each other, the different-pitch wiring element comprising a wiring conductor which is the thick-film conductor claimed in any one of claims 1 to 4.

BEST MODE FOR CARRYING OUT THE INVENTION

Figure 1:
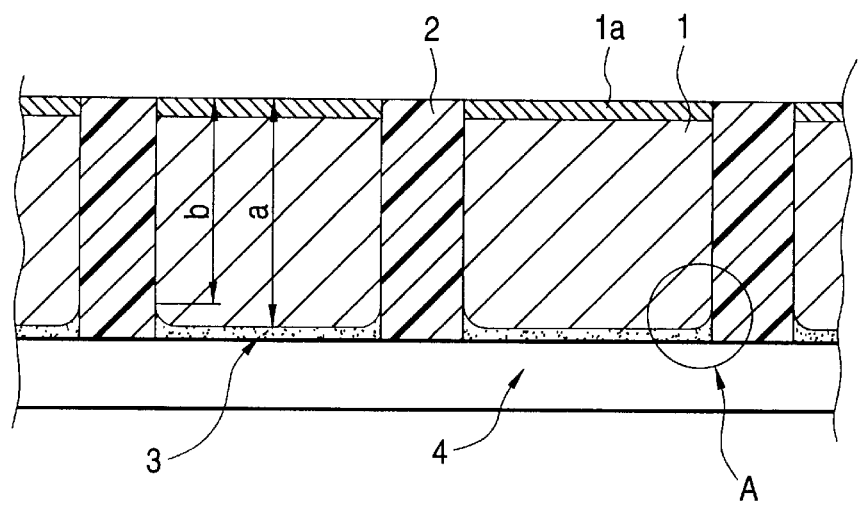
FIG. 1 is a cross sectional view showing a thick-film conductor circuit according to the present invention.

A thick-film conductor circuit according to the present invention is characterized by a zinc-contained layer which exists in a region of a depth of 5 $\mu$m from the surface of a conductor made of copper, which contains zinc atoms by an average content of 3 atom % to 20 atom % with respect to copper atoms and which has a thickness of 0.1 $\mu$m to 5 $\mu$m.

The zinc-contained layer according to the present invention is formed by applying the same to, for example, an aluminum substrate to have a thickness of 0.1 $\mu$m to 5 $\mu$m and by performing an electrolytic plating process using copper-contained plating solution so that the zinc-contained layer exists in the surface layer portion of the copper-plated film to a region of the depth of 5 $\mu$m and which has a thickness of 0.1 $\mu$m to 5 $\mu$m. The aluminum substrate is coated with zinc such that the aluminum substrate is immersed in processing solution (zincate solution) containing, for example, alkali components and zinc ions. The amount of the zinc film can be adjusted by changing processing conditions, such as the composition of the processing solution, processing temperature and a processing period of time. To fine and uniform the zinc film on the surface of the aluminum substrate, it is preferable that a process is performed such that the formed zinc film is dissolved in water solution of nitric acid and then again immersed in the zincate solution so as to again form a zinc film. To firmly apply zinc to the surface of the aluminum substrate, the surface of aluminum may be roughened by using a polishing machine, such as a buff roll machine or a jet scrub machine.

The electrolytic copper plating according to the present invention may be conventional plating, such as copper pyrophosphate plating, copper sulfate plating or combination of copper pyrophosphate plating and copper sulfate plating. In this case, elution of zinc atoms into the plating solution must be prevented to cause the same to exist in the surface layer portion of the copper plated film. To achieve this, the substrate must be injected into the plating solution while voltage is applied to the substrate. If the substrate is injected into the plating solution without application of the voltage, a subtitution reaction occors between zinc and copper, causing zinc to be eluted into the plating solution. Therefore, zinc atoms cannot be caused to exist at a predetermined depth from the surface layer of the conductor at a predetermined content (a diffusion structure cannot be formed). Thus, the oxidation preventive effect of the conductor circuit deteriorates.

The electrolytic copper pattern according to the present invention and containing zinc in the surface layer can be obtained by removing the aluminum substrate after the electrolytic plating has been performed. As a removing means, mechanical separation or etching may be employed.

The zinc-contained layer in the surface layer according to the present invention has a thickness of 0.1 $\mu$m to 5 $\mu$m. The average content of zinc atoms existing in the foregoing layer is 3 atom % to 20 atom % with respect to copper atoms. If the thickness of the zinc-contained layer is smaller than 0.1 $\mu$m or if the average content is lower than 3 atom %, the effect of preventing oxidation of copper becomes unsatisfactory. If the thickness is larger than 5 $\mu$m or the average content is larger than 20 atom %, the effect of preventing oxidation cannot furthermore be improved.

FIG. 1 is a cross sectional view showing the conductor according to the present invention. As shown in the drawing, the conductor 1 has a rectangular cross sectional shape in the widthwise direction (in the horizontal direction in the drawing). Moreover, the conductor 1 has rounded corners at two lower edges A thereof. The zinc-contained layer exists in a region in the surface layer 1a of the conductor 1 to a depth of 5 $\mu$m. In the drawing, reference numeral 2 represents a photosensitive resin composition, and 3 represents a bond. Reference numeral 4 represents an insulating substrate to which the conductor 1 is transcribed.

In the conductor circuit having rounded corners at the two edges A of the conductor 1, concentration of electric fields to the edge portions of the conductor can be relaxed. Thus, phenomena, such as migration which occurs between conductors under hot and wet environment and an electrolytic reaction, which cause short circuit, can be prevented. Therefore, the reliability of the conductor circuit can be improved. If the rounded corners are formed at the two edges A of the conductor, the surface area of the conductor can be enlarged. Therefore, when the conductor circuit is transcribed and secured to the insulating substrate 4 or the like, the adhesiveness can be improved. As a result, the reliability in a hot and wet environment can significantly be improved.

The description "rounded corner" means a structure that each corner of the two lower ends A has a curvature when viewed in the cross sectional shape of the conductor 1.

Specifically, definition is performed by a structure in which the thickness (a) of the central portion of the conductor 1 in the widthwise direction and the thickness (b) at each of the two edges A are different from each other. Although the curvature radius which is capable of relaxing the concentration of electric fields cannot accurately be defined, the value of (a–b) is usually about 2 μm to 20 μm.

The method of manufacturing the thick-film conductor circuit according to the present invention will now be described.

The method comprises the steps of: coating the surface of a conductive substrate with a liquid photosensitive resin composition; exposing a portion, in which a resin pattern must be formed, to a high-energy beam; dissolving or dispersion-removing a non-exposed portion of the photosensitive resin composition with developing solution so that a required resin pattern is formed on the conductive substrate; forming a conductor by electrolytic plating; and removing the conductive substrate.

It is preferable that the present invention has a structure that the conductive substrate is a substrate made of aluminum or aluminum alloy. To easily describe the structure of the present invention, the aluminum substrate includes the substrate made of aluminum alloy.

As a method of removing the aluminum substrate, any one of the following methods may be employed: an etching method using acid, alkali or salt water solution; a polishing and removing method; a mechanical separating method; and their mixture. To remove the aluminum substrate by etching, 1% to 30% hydrochloric acid may be employed. In a case of a copper substrate, about 25% ferric chloride water solution or 10% ammonium persulfate water solution may be employed in the etching process. In order to strengthen the thick-film conductor circuit, a method may be employed in which an insulating material is bonded to the surface opposite to the conductive substrate of the thick-film conductive circuit before or after removal of the conductive substrate. A structure may be employed in which a plurality of circuits are laminated through insulating materials.

If necessary, the resin pattern portion may be removed before the thick-film conductor pattern is transcribed to the insulating substrate or after the same has been transcribed and the conductive substrate has been removed. Then, the portion, from which the resin pattern has been removed, may be filled with other resin, for example, heat resisting resin or the like.

It is preferably that the surface diffusion reflectance of the conductive substrate in the photosensitive wavelength region of the employed liquid photosensitive resin composition is 20% or lower. The defined surface diffusion reflectance is diffusion reflectance in a photosensitive wavelength region of the employed liquid photosensitive resin composition. If the surface diffusion reflectance of the substrate is higher than 20%, the diffusion reflection of incidental light on the surface of the substrate becomes greater. Thus, a bottom portion (a portion adjacent to the surface of the substrate) of the non-exposed portion of the resin pattern is hardened, causing the pattern to encounter fogging or residue to retain. The value of the surface diffusion reflectance can be measured by using a spectrophotometer incorporating an integrating sphere such that the surface diffusion reflectance of a standard white board of barium sulfate is employed as a reference (100%). The conductive substrate has been subjected to surface treatment by a physical surface polishing means. However, the foregoing method enables an excessively high surface diffusion reflectance of the substrate of about 40% to be obtained. Thus, a required resin pattern cannot be obtained.

When only a chemical surface treatment is employed or when the conventional physical polishing and the chemical surface treatment are combined with each other, a substrate having a lowered surface diffusion reflectance of 20% or lower can be obtained. Thus, a required resin pattern can stably be obtained.

A specific surface treatment method for the substrate varies depending on the type of the substrate. For example, a surface treatment method for an aluminum substrate, such as an MBV method, an EW method, a zinc phosphate method, a potassium permanganate method, an iron chloride method or a zincate (a zincate conversion method) method, may be employed. When the copper substrate is employed, a blackening process or the like may be employed.

In particular, an aluminum substrate subjected to the zincate process has great adhesiveness with the portion of the photosensitive resin composition according to the present invention which has been hardened with light. Therefore, the foregoing aluminum substrate is a preferred substrate.

The diffusion reflectance can be adjusted by changing the composition of the processing solution, the processing temperatures and the processing period of time.

The liquid photosensitive resin composition, which has been hardened, has an excellent electrical insulating characteristic. Therefore, it can be employed as a permanent resist to form an insulating layer between conductors (the portion of the photosensitive resin composition given reference numeral 2 and shown in FIG. 1).

The liquid photosensitive resin composition according to the present invention must contain prepolymer, a monomer component, the light polymerization initiator and the photoabsorber. If the photosensitive resin composition is in the form of liquid, the thickness can significantly easily be controlled. Moreover, an excellent development characteristic can be realized. Therefore, a resin pattern having a very high aspect ratio can be formed. Since light dispersion in the resin portion can be prevented, the hardened ratio can be formed into a sharp rectangular shape.

The prepolymer according to the present invention is polyester resin which is obtainable from condensation of a dicarboxylic acid component and a diol component and which has a number average molecular weight of 500 to 5,000, the dicarboxylic acid component containing compound (a) having a component expressed by the following chemical formula (1) at a molar ratio of 0.1 to 0.4 and compound (b) having a component expressed by the following chemical formula (2) at a molar ratio of 0.1 to 0.4 when the overall molar ratio of the dicarboxylic acid component is 1:

chemical formula (1)

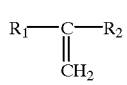

chemical formula (2)

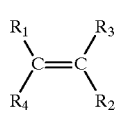

where $R_1$ and $R_2$ are each —COOH or —CH$_2$COOH and $R_3$ and $R_4$ are each —H or —CH$_3$.

That is, the prepolymer according to the present invention is formed by combining compounds which contain unsaturated groups having different reaction rates. When the resin pattern is formed, crosslinking of unsaturated groups of th compound (a) is used to cause the exposed portion to have relief strength in a low exposure region in which no fogging occurs. Then, crosslinking of unsaturated groups of the compound (b) having a low reaction rate is used to improve the relief strength and the adhesiveness with the substrate. As a result, a thick-film pattern having short pitches, that is, a hardened resin pattern having a high aspect ratio, can be formed.

The foregoing prepolymer can be prepared by using the following components: a dicarboxylic acid component, such as itaconic acid, having an unsaturated group at a terminal thereof and expressed by chemical formula (1): a dicarboxylic acid, such as fumaric acid, maleic acid, mesaconic acid, citraconic acid or glutaconic acid, having an unsaturated group between two carboxylic groups and expressed by chemical formula (2); dibasic acid of dicarboxylic acid, such as adipic acid or phthalic acid, having no unsaturated group or its anhydride component; an alcohol component of alkyl diol or diol having five or less ether linkages in the molecule thereof or a dihydric alcohol component composed of their mixture. The foregoing components are subjected to dehydration polycondensation (formed into ester) in a nitrogen atmosphere and reduced pressure. Thus, the prepolymer having a required density of unsaturated bonds and number average molecular weight can be prepared.

It is preferable that the molar ratio of the unsaturated bonds of the compound (a) is 0.1 to 0.4 with respect to 1 which is the molar ratio of all of dicarboxylic acid components in the prepolymer. If the molar ratio is lower than the above-mentioned value, degree of crosslinking in the photolithography process becomes insufficient. As a result, the strength of the resin deteriorates, causing the resin pattern to be inclined or allowed to fall. In this case, seepage of the resin components takes place. If the molar ratio is higher than the above-mentioned value, too many crosslinking points results in the flexibility of the resin pattern being allowed to deteriorate. As a result, cracks are formed and the non-exposed portion easily encounters fogging. It is preferable that the molar ratio of the unsaturated bond group component in the compound (b) is 0.1 to 0.4. If the molar ratio is lower than the above-mentioned value, the crosslinking reaction cannot sufficiently be performed after the resin pattern has been formed. As a result, the adhesiveness with the substrate deteriorates and seepage of the resin component takes place. If the molar ratio is higher that the above-mentioned value, also the flexibility of the resin pattern deteriorates and cracks are formed. Thus, a satisfactory result cannot be obtained.

The prepolymer formed by combining the above-mentioned unsaturated groups having the foregoing densities exhibits excellent reactivity. Therefore, the foregoing prepolymer is not a preferred photosensitive resin composition because of unsatisfactory reservation characteristic for a long time. The inventors of the present invention positively uses the above-mentioned reactivity and specifies the mixture ratio of the foregoing components. As a result, a fact was found that the foregoing prepolymer is a significantly advantageous component of the photosensitive resin composition for forming a pattern having a short pitch and a high aspect ratio.

It is preferably that the component of the dicarboxylic acid except for compound (a) and compound (b) and contained by the molar ratio of 75% or higher is compound (c) having the component expressed by the following chemical formula (3):

$$HOOC-(CH_2)_n-COOH \quad (n=3 \text{ to } 8) \qquad \text{Chemical Formula (3)}$$

If the compound (a) is contained by a molar ratio of 0.25 and the compound (b) is contained by a molar ratio of 0.25, not lower than 75% of the residual portion, which is 0.5, that is, not smaller than 0.375 is the compound (c). When the foregoing straight-chain alkyl dicarboxylic acid is employed, the viscosity of the photosensitive resin can be lowered and the development characteristic can significantly be improved. The compound (c) is exemplified by glutaric acid, adipic acid and sebacic acid. Since the conventional unsaturated polyester resin generally has poor reactivity, aromatic dicarboxylic acid is usually employed to reinforce the strength after it has been hardened. However, the inventors improve the reactivity by dint of the compound (a) and the compound (b) to improve the strength after hardening. Moreover, the straight-chain alkyl carboxylic acid component is employed in place of the aromatic dicarboxylic acid in the corresponding quantity so that the three characteristics which are the resolution, the development characteristic and contamination resistance against the plating solution are satisfied. Thus, a photosensitive resin composition which is an excellent resist for plating has been found.

It is preferably that the number average molecular weight of the prepolymer in 500 to 5,000. If the molecular weight is smaller than 500, contraction takes place excessively or realized sensitivity is insufficiently low. Thus, a practically satisfactory result cannot be obtained. If the molecular weight is larger than 5,000, the viscosity becomes too high to prevent a defect in the development. Since the photosensitive resin composition containing the foregoing prepolymer is not diluted with solvent or the like and the same is used in the form of a liquid photosensitive resin composition, it is preferably that the molecular weight satisfies a range from 800 to 3,000 in practical viewpoints to realize satisfactory viscosity, film forming easiness and development characteristic. The number average molecular weight can be controlled by changing the temperature, pressure and the period of time of the polycondensation reaction. The number average molecular weight can conveniently be measured by a method in which the acid value is obtained by titration using KOH standard solution and the number average molecular weight is obtained from the molar concentration of the non-reacted carboxylic groups.

The polymerizable monomer component according to the present invention which has at least three acryloyl groups or methacryloyl groups in one molecule thereof and which is combined with carbon atoms to which the aclyloyl group or the methacryoyl group is combined such that fifteen or less carbon atoms and/or oxygen atoms exist is an essential component to realize 20 pieces/mm or denser, that is, the pitch of 50 $\mu$m or shorter and the thickness of 20 $\mu$m required for the photosensitive resin pattern. That is, the dimension ratio (the aspect ratio) of the height with respect to the width of the cross sectional shape of the photosensitive resin pattern is enlarged to prevent inclination and falling by raising the crosslinking density after the photopolymerization so as to strengthen the pattern.

On the other hand, the photosensitive resin composition must completely be removed from the non-exposed portion of the surface of the conductive substrate with the developing solution in order to perform plating. Therefore, excessive polymerization and crosslinking which inhibits removal of the photosensitive resin composition with the developing solution because of the dispersion of the exposing system and diffraction of light must be prevented. That is, the difference between the crosslinking density of the pattern portion and that of the non-exposed portion must be enlarged. Therefore, the at least one component of the monomer component must be polymerizable monomer having at least three aclyloly groups methacryoyl groups in one molecule thereof. If only a polymerizable monomer having not more than two aclylyoyl groups or methacryoyl groups is used if a monomer having a structure that the number of atoms (carbon atoms and oxygen atoms) existing between carbon atoms to which the acylyloyl group of the methacryoyl group of the polymerizable monomer having three or more aclyloyl groups methacryoyl groups is not smaller than 16 is used, the crosslinking density of the resin pattern satisfactory for the present invention cannot be realized. In the foregoing cases, the pattern becomes too soft and thus the pattern falls or the adjacent patterns abut against each other. Therefore, a required resin pattern cannot be obtained.

In view of the foregoing, the monomer component which contains at least one type of a compound which has at least three acryloyl groups or methacryloyl groups in one molecule thereof and which is combined with carbon atoms, to which the aclyloyl group of the methacryoyl group is combined such that fifteen or less, preferably seven or less, carbon atoms and/or oxygen atoms exist is an essential component of the present invention.

The monomer contains at least three aclyloyl groups or the methacryoyl groups in one molecule thereof. If an excessively large number of the groups exists, the number of reactive groups which take part in the photoreaction is limited. On the other hand, scum (residues of semi-hardened resin component) retains on the surface of the non-exposed portion of the substrate. Then, there arises a critical problem of defective adhesion of plating or the like in the following plating process. It is preferably that the number of the aclyloyl groups or the methacryoyl groups in the monomer is 3 to 10.

The monomer component can be detected by liquid chromatography or gas chromatography.

The meaning of the description that the not more than 15 carbon atoms and/or oxygen atoms exist between carbon atoms to which the aclyloyl group or the methacryoyl group is combined will now be described.

The "carbon atom" to which the aclyloyl group or the methacryoyl group is combined is a carbon atom adjacent to a hydroxyl group adjacent to an acrylic acid or methacrylic acid through an ester bond. The carbon atom adjacent to the hydroxyl group is a carbon atom combined with a hydroxyl group which is generated when hydrolysis of ester has been performed. That is, not more than 15 carbon atom or oxygen atoms oxygen atoms are combined between the carbon atom when counting is performed in the shortest distance. If the number is zero, the carbon atoms are combined with each other and the case in which the carbon atoms are the same is not included. The number of atoms between the carbon atoms is counted such that an arbitrary carbon atom among three or more carbon atoms and a carbon atom having the smallest number of atoms between the carbon atoms is selected from the two or more residual carbon atoms. The foregoing number is the number of atoms between the carbon atoms.

Specifically, a material having the structure that the number of carbon atoms and/or oxygen atoms between carbon atoms is one is exemplified by trimethylol propane trimethacrylate and dipentaerythritol hexaacrylate. The materials having thirteen carbon atoms and/or oxygen atoms between the carbon atoms is exemplified by tri [acryloyl-di (oxyethyl)] trimethylol propane. The material having zero carbon atoms and/or oxygen atoms between the carbon atoms is exemplified by glyceroltriacrylate.

The polymerizable monomer component contains at least one type of a compound which has at least three acryloyl groups or methacryoyl groups in one molecule thereof and which is combined with carbon atoms to which the aclyloyl group or the methacryoyl group is combined such that fifteen or less carbon atoms and/or oxygen atoms exist is exemplified by the following materials: trimethylolpropane triacrylate or methacrylate; triacryloyl or trimethacryloyl ethyltrimethylolpropane; di (ethleneoxy) trimethylolpropane triacrylate or methacrylate; pentaerythritol acrylate or methacrylate; pentaerythritol acrylate or methacrylate; dipentaerythritol tetra/penta/hexaacrylate or methacrylate; glycerol triacrylate or methacrylate; a compound having a structure that a mono or poly (oxyethyl) group or a mono or poly (oxypropyl) group is inserted to a position adjacent to the ester group of acrylate or methacrylate of the foregoing compound; and a compound in which acryloyl groups or methacryloyl groups have been inserted into three to ten hydroxyl groups of alkylpolyol, such as polyhydric alcohol or vinyl alcohol oligomer obtainable from condensation of a compound having three or more hydroxyl groups. The foregoing polymerizable monomer may be employed solely or two or more component may be combined with one another. If the content of the polymerizable monomer is too small, the strength of the resin pattern is unsatisfactory to obtain the effect of the present invention. If the content is too large, there arises a problem of cracks formed in the resin pattern. In the present invention, it is preferable that the content of the polymerizable monomer is 1 part by weight to 30 parts by weight with respect to 100 parts by weight of the prepolymer, more preferably 3 parts by weight to 15 parts by weight.

To obtain a further satisfactory pattern, or to easily handle the composition, the photosensitive resin composition according to the present invention may be added with a variety of components as required. For example, a monomer having not more than two polymerizable functional groups in one molecule thereof may be employed to adjust the viscosity of the photosensitive resin composition. To improve the adhesiveness with the conductive substrate, a polymerizable monomer having a phosphoric acid group may be employed. To improve the reservation characteristic of the photosensitive resin composition, a heat polymerization inhibitor may be contained. To shorten reaction period of time and hardening period of time of the photosensitive resin composition or to improve the sensitivity and the resolution, a photosensitizer or the like may be added.

The photosensitivity wavelength of the light polymerization initiator according to the present invention is not limited particularly. However, a light polymerization initiator having a light absorption peak in the wavelength region from 300 nm to 420 nm is a preferred material. It is preferably that the molar absorbance coefficient of the material is 5 l/mol·cm to 1000 l/mol·cm. That is, a 300 nm to 420 nm light source may be a usual high pressure mercury vapor lamp. Therefore, the light polymerization initiator can be industrially prepared with a significantly low cost. If a light polymerization initiator having a molar absorbance coefficient of 1000 l/mol·cm or larger is employed, light cannot reach the inside portion of the photosensitive resin composition. Therefore, the photosensitive resin composition cannot sufficiently be hardened. If the exposing period of time is elongated, portions which must not be hardened are undesirably be hardened. Thus, the conductor cannot be formed by plating. If a light polymerization initiator having a molar absorbance coefficient smaller than 5 l/mol·cm is employed, the sensitivity of the photosensitive resin composition is unsatisfactory to practically employ the same.

The molar absorbance coefficient and the light transmittance can be measured by a usual spectrophotometer.

The above-mentioned light polymerization initiator is exemplified by benzoin, benzoin methylether, benzoin ethylether, benzoin isopropylether, benzoin isobutylether, benzoin butylether, 2, 2-dihydroxy-2-phenylacetophenone, 2, 2-dimethoxy-2-phenylacetophenone and 2, 2-diethoxy-2-phenylacetophenone.

The photoabsorber according to the present invention is not limited particularly if the employed absorber is able to absorb light in the required wavelength region and it can be uniformly dissolved or dispersed in the liquid photosensitive resin composition. The photoabsorber may be a pigment absorber or an ultraviolet ray absorber. The photoabsorber attains an effect to efficiently absorb diffraction of light occurring owning to dispersion or reflection of the exposing system so as to prevent excessive hardening of the portion which must be free from hardening to a degree at which removal of the liquid photosensitive resin composition with the developing solution is inhibited.

It is an important fact for the present invention to combine the light polymerization initiator and the photoabsorber with each other to control the light transmittance of the photosensitive resin composition. Therefore, it is preferably that the light polymerization initiator having the molar absorbance coefficient of 5 liter/mol·cm to 1000 litter/mol·cm at the photoabsorption peak is contained by 0.1 wt % to 10 wt %. Moreover, the photoabsorber is contained by 0.01 wt % to 1 wt % to realize the light transmittance of 15% to 75%. When the light polymerization initiator and the photoabsorber are used at the above-mentioned mixture ratio, hardening of the non-exposed portion of the photosensitive resin composition can be prevented. Thus, even a thick film having a thickness of 100 $\mu$m enables a high resolution of a resolution pitch of 50 $\mu$m or shorter to be realized. Moreover, the development characteristic of the non-exposed portion can be improved. Therefore, when the conductor is formed on the conductive substrate by plating or the like, disconnection and undesirable reduction in the width of the conductor can be prevented. As a result, a reliable and low-resistance thick-film conductor can be formed. A photoabsorber of a type which has a small absorbance coefficient and which cannot adjust the light transmittance to be 75% or lower if the content is 1 wt % or smaller easily and undesirably encounters dissolution, defective dispersion and exudation (bleeding out). A further preferred range for the light polymerization initiator of the photosensitive resin composition if 0.5 wt % to 5 wt % and for the light transmittance is 20% to 60%. That is, the sensitivity of the photosensitive resin composition with respect to ultraviolet rays is the preferred range in viewpoints of the exposing period of time and the easy handling.

According to the present invention, the above-mentioned photosensitive resin composition enables a variety of thick-film conductor circuit to be formed.

Figure 2:
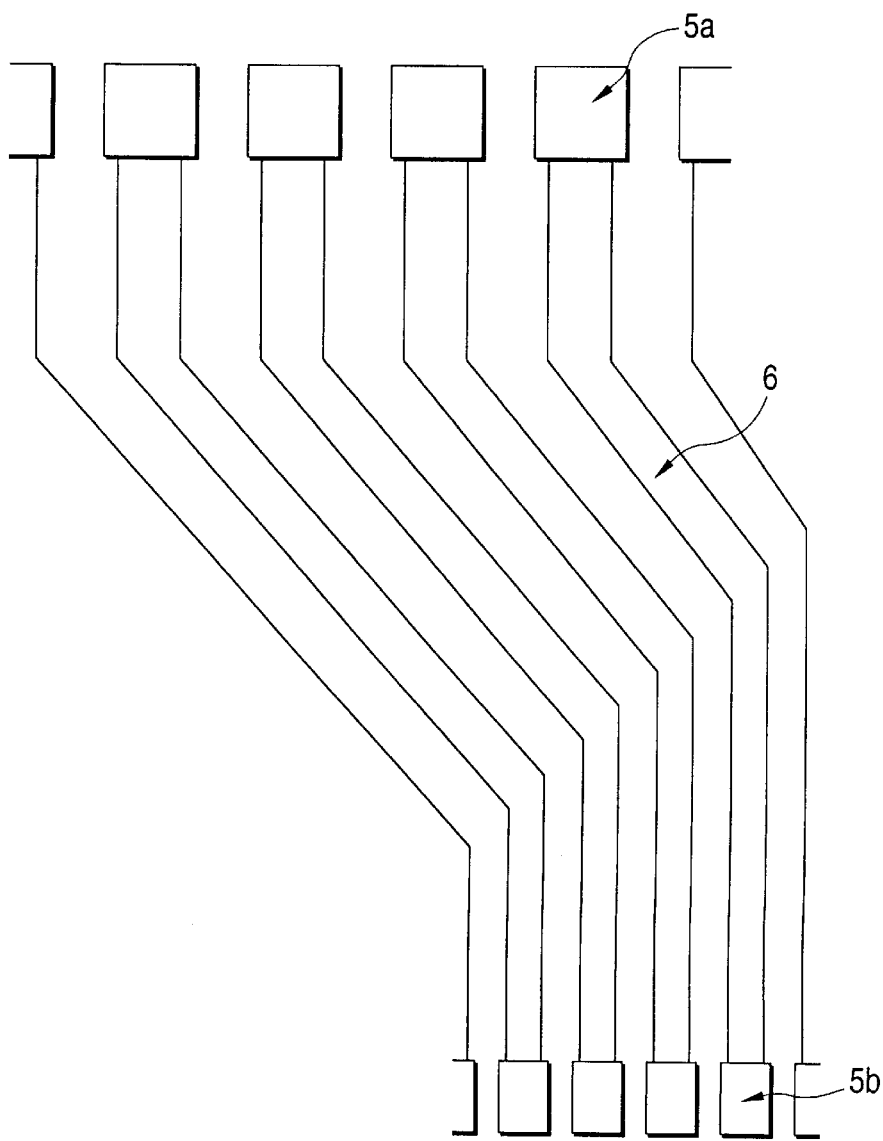
FIG. 2 is an upper schematic view showing a different-pitch wiring element to which the thick-film conductor circuit according to the present invention has been applied.

FIG. 2 is a schematic view showing the different-pitch wiring element for connecting elements having different wiring pitches. As shown in the drawing, an element 5a having a long wiring pitch and an element 5b having a short wiring pitch are connected to each other by a conductor 6. The conductor pattern of the above-mentioned different-pitch wiring element adjacent to the element 5b cannot easily be formed. However, the photosensitive resin composition according to the present invention is able to form a thick-film conductor pattern such that a satisfactory dimension accuracy and shape stability are maintained.

Figure 3:
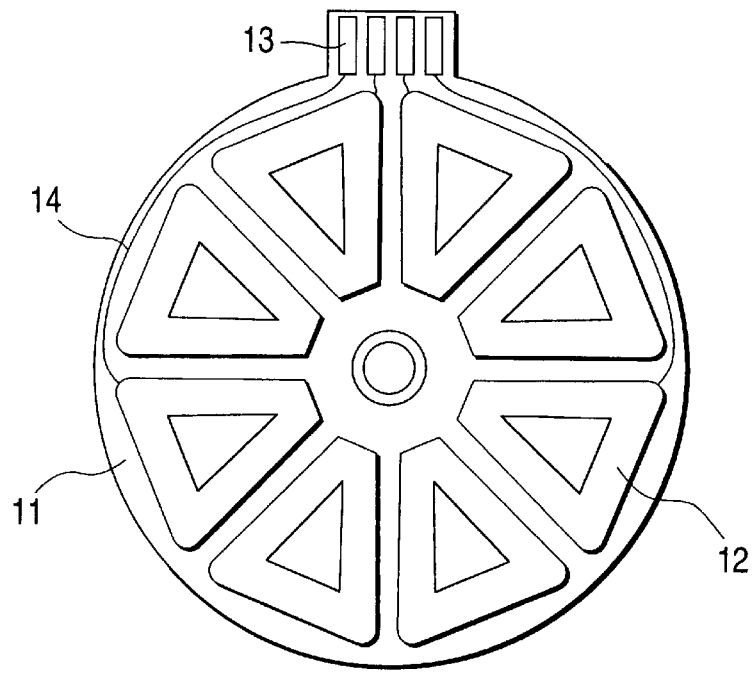
FIG. 3 is an upper schematic view showing a flat coil to which the thick-film conductor circuit according to the present invention has been applied.

FIG. 3 is a top view showing a flat coil. As shown in the drawing, the flat coil has a structure that a coil conductor 12 is formed on an insulating substrate 11. When the photosensitive resin composition according to the present invention is employed, the coil conductor 12 having a high aspect ratio, provided with rounded corners at the two edges and formed into a rectangular cross sectional shape can be obtained.

Figure 4:
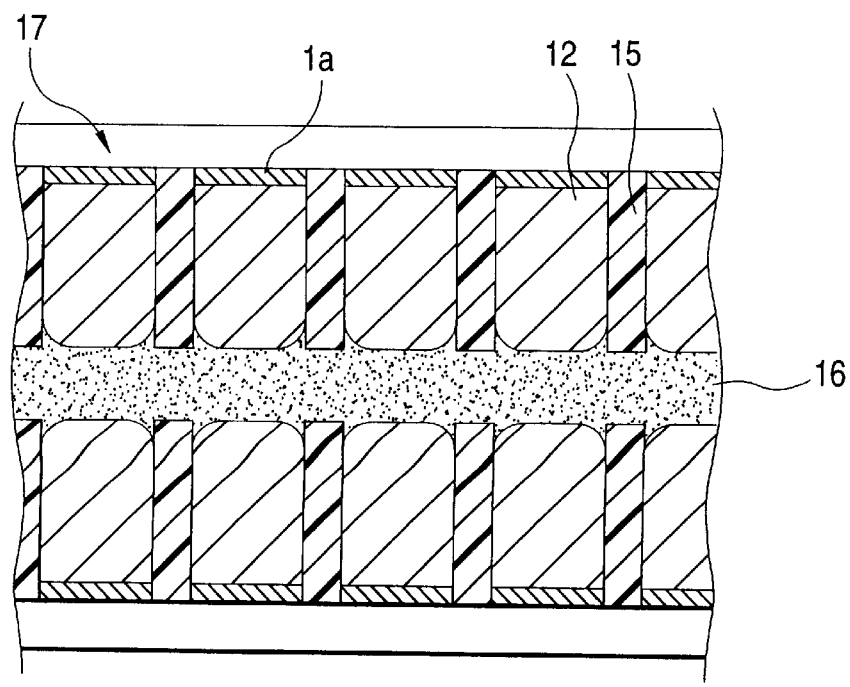
FIG. 4 is an enlarged cross sectional view showing a coil conductor portion of the flat coil shown in FIG. 3.
Figure 5:
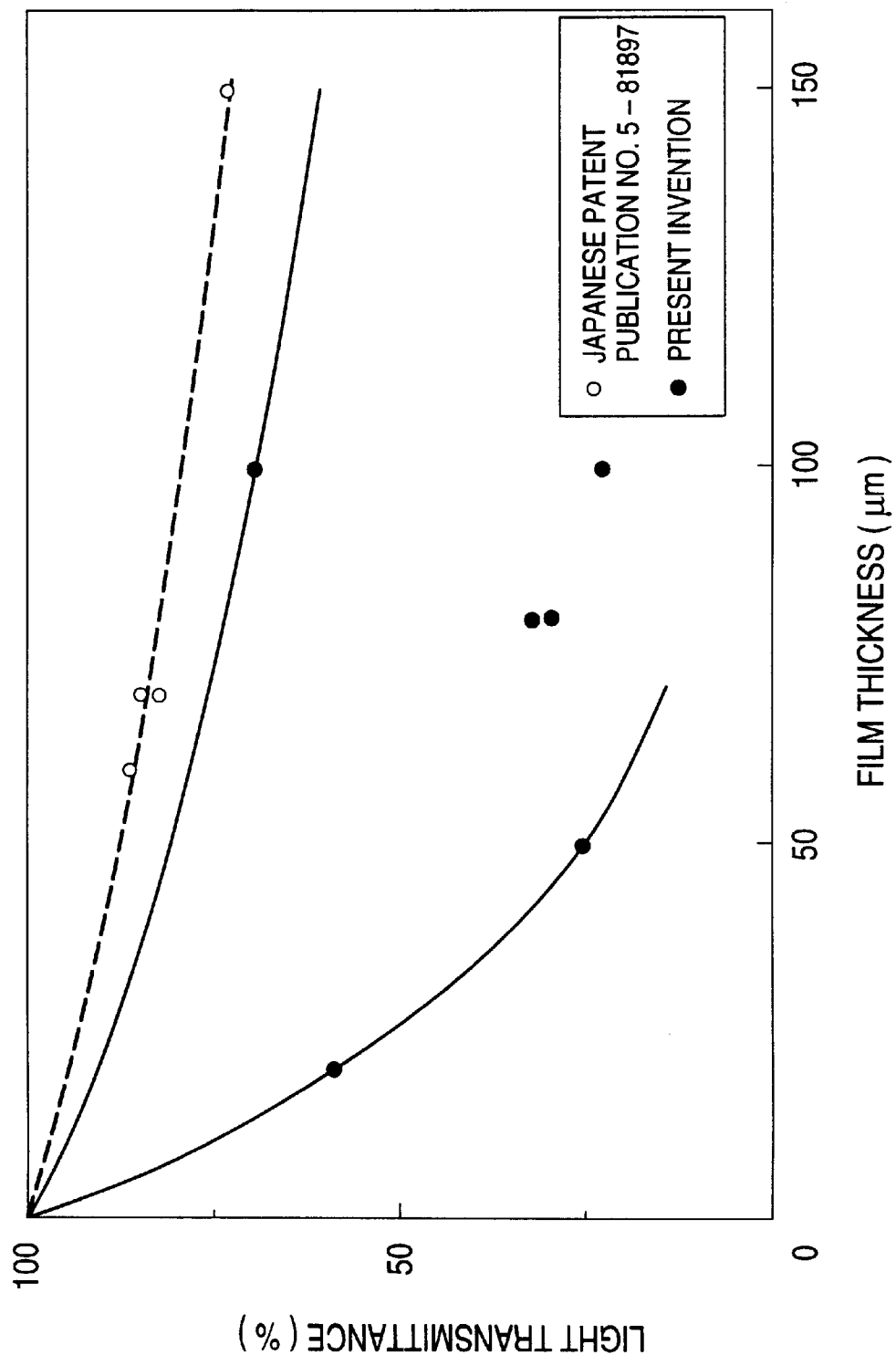
FIG. 5 is a graph showing the relationship between thicknesses and light transmittance of a photosensitive resin composition for use in a method of manufacturing the thick-film conductor circuit according to the present invention and a photosensitive resin composition for use in a method of manufacturing a conventional thick-film conductor circuit (refer to Japanese Patent Publication No. 5-81897).

In FIGS. 3 and 4, reference numeral 13 represents a terminal portion, 14 represents a wired line, 15 represents a hardened photosensitive resin composition, 16 represents an interlayer bond and 17 represents a solder resist.

Examples of the present invention will now be described. Note that the present invention is not limited to the following examples.

EXAMPLE 1

An aluminum substrate having a thickness of 100 $\mu$m was immersed in a zincate processing solution (STJS-STAR ZN2) diluted to two times and manufactured by Okuno at a temperature of 40° C. for 60 seconds. Then, the surface of the substrate was ringed under running water. Then, the surface zinc layer was dissolved with 15 wt % nitric acid solution after which the substrate was again processed with the zincate processing solution. As a result of the foregoing process, a zinc film having a thickness of 0.3 $\mu$m was formed on the aluminum substrate.

Then, the processed aluminum substrate was immersed in copper pyrophosphate plating solution in a state in which a voltage was applied to the aluminum substrate so that electrolytic plating was performed for 18 minutes at 55° C. and a current density of 3A/dm$^2$. Thus, a copper film having a thickness of about 20 $\mu$m was formed. Then, copper sulfate electrolytic plating was performed for 90 minutes at 35° C. and a current density of 2 A/dm$^2$.

A bond (Cemedine EP008 or EP170) was screen-printed to the surface of the manufactured substrate, and then transcribed and bonded to the surface of an epoxy glass substrate. Then, the aluminum substrate was removed by etching using 10% hydrochloric acid.

The content of zinc adjacent to the surface of the electrolytic copper plated film formed on the epoxy glass substrate was quantitatively analyzed by using an Auger electron spectroscopy apparatus (manufactured by Hitachi). As a result, zinc was observed to a region at a depth of 3 $\mu$m from the surface of the substrate. The average content of zinc in the foregoing region was 10 atom %.

The obtained substrate electrolytically plated with copper was allowed to stand at a temperature of 35° C. and humidity of 90% for 10 days. Then, the Auger electron spectroscopy apparatus was used to analyze a region in which oxygen existed in the direction of the depth from the surface electrolytically plated with copper. As a result, oxygen existed to only a region of a depth of about 0.4 $\mu$m from the surface of copper.

COMPARATIVE EXAMPLE 1

A copper plated film was formed on a non-processed aluminum substrate under plating conditions similar to those of Example 1, and then transcribed and bonded to the surface of an epoxy glass substrate. Then, the aluminum substrate was removed by etching using 10% hydrochloric acid.

The obtained substrate electrolytically plated with copper was allowed to stand at a temperature of 35° C. and humidity of 90% for 10 days. Then, the Auger electron spectroscopy apparatus was used to analyze a region in which oxygen existed in the direction of the depth from the surface electrolytically plated with copper. As a result, oxygen existed to a region of a depth of about 0.9 µm from the surface of copper.

A fact can be understood that introduction of an zinc-contained layer into the surface of the conductor significantly improves the oxidation resistance of the surface of copper.

Then, the aluminum substrate processed similarly to that in Example 1 was immersed in copper pyrophosphate plating solution similarly to Example 1 except for applying of voltage was started one minute after so that electrolytic plating was performed. Thus, a substrate electrolytically plated with copper was manufactured.

The content of zinc in the direction of the depth from the surface of the substrate electrolytically plate with copper was analyzed by using the Auger electron spectroscopy apparatus. Results were shown in Table 1. As can be understood from the table, zinc atoms exists in the surface layer of the conductor at a depth of 5 µm when the substrate was immersed (as was done in the present invention) in the state in which the voltage was applied. On the other hand, when the substrate was immersed in the processing solution without application of the voltage, zinc atoms were eluted into the processing solution, Therefore no zinc atom exists in the surface layer of the conductor.

TABLE 1

| Depth from Surface of Conductor | Voltage Applied | No Voltage Applied |
| --- | --- | --- |
| 0 (surface) | 12.1 | Not Detected |
| 0.2 µm | 10.8 | Not Detected |
| 0.6 µm | 8.7 | Not Detected |
| 0.8 µm | 6.9 | Not Detected |
| 1.0 µm | 6.0 | Not Detected |
| 2.5 µm | 1.1 | Not Detected |
| 5.0 µm | Not Detected | Not Detected |

EXAMPLE 2

Diethylene glycol, propylons glycol, adipic acid, fumaric acid and itaconic acid were injected into a reactor at molar ratios 0.38/0.12/0.24/0.14/0.12 such that the overall weight was 1 Kg. Then, 0.25 g of 4-methoxyphenol and 2.5 g of triethanol amine phosphate were added as thermal polymerization inhibitors. Then, the solution was polycondensed in a nitrogen atmosphere, at a reaction temperature of 200° C. for four hours under reduced pressure. Thus, unsaturated polyester prepolymer composition having a number average molecular weight of 1500 was prepared. Then, 12 parts of tetraethylene glycol dimethacrylate, 5 parts of diethylene glycol dimethacrylate, 8 parts of 2-hydroxyethylmethacrylate, 15 parts of pentaerythritol nethacrylate, 5 parts of phomphomono (methacryloyloxyethyl), 2 parts of 2,2-dimethoxy-2-phenylacetophanone, 0.05 part of 4-tert-challis-butyl catechol and 0.1 part of Xayaset Red A-BR manufactured by Nihon Kayaku were added to 100 parts by weight of the prepolymer. The solution was sufficiently stirred and mixed so that a photosensitive resin composition was obtained.

Then, the foregoing photosensitive resin composition was applied to the surface of an aluminum substrate processed similarly to Example 1 by using an SRB apparatus manufactured by Asahi Kasei. At this time, the thickness of the resist layer was made to be 100 µm by performing adjustment using a spacer. Ultraviolet rays emitted from a mercury short arc lamp were applied through a predetermined glass mask corresponding to a wiring pattern having a density of 20 lines/mm. Then, non-exposed portion was developed with 1% sodium borate solution, after which 85° C. hot water was used to rinse the substrate for 10 minutes so that post hardening was performed. Thus, a resin pattern was formed.

The obtained substrate having the formed resin pattern was immersed in copper pyrophosphate plating solution (manufactured by Uemura Industry) in a state in which a voltage was applied to the substrate. Under condition that the current density was 3A/dm$^2$ at the cathode, a copper plated film having a thickness of 90 µm was deposited so that a pattern conductor was formed. A bond (Cemedine EP008 or EP170) was screen-printed to the surface of the obtained substrate, and then transcribed and boded to the surface of the epoxy glass substrate. Then, the aluminum substrate was mechanically separated and removed so that a thick-film conductor circuit was formed.

The obtained substrate was cut into 2 cm×2 cm square pieces, and then hardened with epoxy resin. Then, the cross section of the sample was mirror-polished by a polishing machine so that the shape of the thick-film conductor was observed. As a result, a moderate curvature radius was observed in which the repeated pitch was 50 µm, the thickness at the upper end of the conductor was 99 µm and the thickness of the two ends at the upper ends of the conductor was 92 µm. The overall cross sectional shape of the conductor was in the rectangular shape. The ratio of the width of the conductor and that of the photosensitive resin composition was 1.5.

The electric characteristics of the obtained circuit pattern were measured, resulting in the insulation resistance between conductors was 2×10$^5$ MΩ or higher, and the dielectric breakdown voltage was 1 kV or higher. In an environment that the temperature was 85° C. and the humidity was 90%, the resistance reduction ratio 1000 hours after was ±2 or lower, which was a significantly small value. Even under conditions that the temperature was 85° C., the humidity was 90% and 24V DC was applied for 100 hours, deterioration of the surface, such as deposition of copper from the surface of the conductor, was not observed. Thus, the satisfactory reliability of the thick-film conductor circuit according to the present invention was confirmed.

EXAMPLE 3

Diethylene glycol, propylene glycol, adipic acid, fumaric acid, itaconic acid and isophthalic acid were injected into a reactor at molar ratios 0.375/0.125/0.17/0.15/0.15/0.03 such that the overall weight was 1 Kg. Then, 0.25 g of 4-methoxyphenol and 2.5 g of triethanol amine phosphate were added as thermal polymerization inhibitors. Then, the solution was polycondensed in a nitrogen atmosphere, at a reaction temperature of 200° C. for four hours under reduced pressure. Thus, unsaturated polyester prepolymer composition having an acid value of 32 mg KOH/g (converted into number a average molecular weight of 1750) was prepared.

Then, 12 parts of tetraethylene glycol dimethacrylate, 5 parts of diethylene glycol dimethacrylate, 8 parts of 2-hydroxyethylmethacrylate, 12 parts of pentaerythritol methacrylate, 3 parts of pentaerythritol tetramethacrylate, 5 parts of phosphomono (methacryloyloxyethyl), 2 parts of 2,2-dimethoxy-2-phenylacetophanone, 0.05 part of di-tert-challis-butyl-4-methylphenol and 0.15 part of Kayaset Red A-2G manufactured by Nihon Kayaku were added to 100 parts by weight of the prepolymer. The solution was sufficiently stirred and mixed so that a photosensitive resin composition was obtained.

An aluminum substrate having a thickness of 100 μm was immersed in a zincate processing solution (SUB-STAR ZN2) diluted to two times and manufactured by Okuno at a temperature of 30° C. for 80 seconds. Then, the surface of the substrate was rinsed under running water. Then, the surface zinc layer was dissolved with 15 wt % nitric acid solution after which the substrate was again processed with the zincate processing solution. As a result of the foregoing process, a zinc film having a thickness of 0.24 μm was formed on the aluminum substrate.

Then, the foregoing photosensitive resin composition was applied to the surface of the processed aluminum substrate to have the thickness of 100 μm. Ultraviolet rays emitted from a mercury short arc lamp were applied through a photomask corresponding to a wiring pattern having a density of 20 lines/mm (a wiring pitch of 50 μm). Then, a non-exposed portion was developed with 1% sodium borate solution, after which 85° C. hot water was used to rinse the substrate for 10 minutes so that post hardening was performed. Thus, a resin pattern was formed.

Then, the processed aluminum substrate was immersed in copper pyrophosphate plating solution in a state in which a voltage was applied to the aluminum substrate having the resin pattern formed thereon so that electrolytic plating was performed at 55° C. for 18 minutes at a current density of 3A/dm$^2$. Thus, a copper film having a thickness of about 20 μm was formed. Then, copper sulfate electrolytic plating was performed for 90 minutes at 35° C. and a current density of 2 A/dm$^2$.

A bond (Cemedine EP008 or EP170) was screen-printed to the surface of the manufactured substrate, and then transcribed and bonded to the surface of an epoxy glass substrate, Then, the aluminum substrate was removed by etching using 10% hydrochloric acid. As a result, a thick-film conductor circuit having a wiring density of 20 lines/mm and incorporating a conductor having a thickness of 100 μm was obtained.

The content of zinc in the surface layer of the thick-film conductor circuit formed on the epoxy glass substrate was quantitatively analyzed by using an Auger electron spectroscopy apparatus (manufactured by Hitachi). As a result, zinc was observed to a region at a depth of 2.2 μm from the surface of the substrate. The average content of zinc in the foregoing region was 8 atom %.

The obtained thick-film conductor circuit was allowed to stand at a temperature of 35° C. and humidity of 90% for 10 days. Then, the Auger electron spectroscopy apparatus was used to analyze a region in which oxygen existed in the direction of the depth from the surface of the conductor. As a result, oxygen existed to only a region of a depth of about 0.4 μm from the surface of the conductor.

Thus, excellent oxidation resistance can be realized even with a dense thick-film conductor circuit.

COMPARATIVE EXAMPLE 2

An unsaturated polyester prepolymer composition was prepared similarly to Example 3 except for the molar ratio of the injected materials being made such that diethylene glycol, propylene glycol, adipic acid, tumaric acid, itaconic acid and isophthalic acid was 0.375/0.125/0.30/0.125/0.025/0.05. The component ratio expressed by chemical formula (1) of the foregoing composition did not satisfy the range of the present invention.

A resin pattern was formed similarly to Example 3, resulting in the resin pattern being partially inclined and in contact with an adjacent pattern. The conductor was not formed in the above-mentioned portion. As a result of liquid chromatograph, bleeding out of the resin component into the plating solution took plate. Thus, the copper film encountered blooming and warp, causing the lifetime of the plating solution to be shortened. A Hull cellithography test performed after the substrate was plated over an area of 100000 m$^2$ of the plating solution resulted in a luster region to be eliminated.

EXAMPLE 4

Diethylene glycol, fumaric acid, isophthalic acid and itaconic acid were polycondensed at molar ratios of 0.5/0.13/0.24/0.13 under the same conditions as those of Example 3. Thus, unsaturated polyester prepolymer having an an acid value of 33 mgKOH/g (converted into a number average molecular weight of 1700) was prepared.

Then, 15 parts of tetraethylene glycol dimethacrylate, 5 parts of diethylene glycol dimethacrylate, 5 parts of 2-hydroxyethyl methacrylate, 3 parts of diacetone acrylamicle, 12 parts of trimethylol propane trimethaorylate, 5 parts of phosphomono (methacryloyloxyethyl), 4 parts of benzoin isobutylether, 0.05 part of 4-tert-challia-butyl catechol and 0.12 parts of oil Yellow 3G manufactured by Orient were added to 100 parts by weight of the prepolymer. Then, the solution was sufficiently stirred and mixed so that photosensitive resin composition A was obtained.

Moreover, a photosensitive resin composition B was obtained similar to the above-mentioned process except for adipic acid being employed as a compound having the component isophthalic expressed by chemical formula (3) in place of isoptalic acid.

Then, each of the photosensitive resin compositions A and B was applied to the surface of the aluminum substrate processed similarly to Example 1 to have a thickness of 90 μm. Then, a photomask corresponding to a wiring pattern having a density of a pitch of 45 μ was used to form a resin pattern by a method similar to that according to Example 3. Then, the same conditions as those of Example 3 were employed so that electrolytic copper plating was performed, and then the aluminum substrate was removed by etching using 10% hydrochloric acid so that a thick-film conductor circuit element having a wiring pitch of 45 μm and incorporating a conductor having a thickness of 90 μm was obtained.

The element obtained by using the photosensitive resin composition B was free from disconnection and an excellent thick-film conductor circuit element was obtained. The element obtained by using the photosensitive resin composition A encountered a bridge shape portion omitted from development after the photosensitive resin was developed. Moreover, about elements encountered disconnection. However, the residual elements were used as thick-film conductor circuits.

COMPARATIVE EXAMPLE 3

A photosensitive resin composition was prepared by a method which is the same as that employed in Example 4 except for propylene glycol dimethacrylate being employed in place of trimethyl propane trimethacryldte of the photosensitive resin composition B according to Example 4. The prepared photosensitive resin composition was used to form a resin pattern similar to that according to Example 4. The formed resin pattern is too soft as compared with the resin pattern obtained in Example 4. Thus, adjacent patterns were in contact with each other. The conductor after the plating was performed was disconnected. Thus, the obtained resin pattern was not used as the thick-film conductor circuit.

When the period of time for which ultraviolet rays was applied was doubled to strengthen the resin pattern, also resin in the non-expos ed portion was undesirably hardened. Thus, the conductor was not formed by plating.

EXAMPLE 5

An aluminum substrate manufactured by Toyo Aluminum and having a thickness of 100 μm was subjected to surface treatment at 30° C. for 60 seconds by using SUB-STAR ZN2 manufactured by Okuno. Then, 15% nitric acid was used to etch the aluminum substrate at 30° C. for 120 seconds. Then, SUB-START ZN2 was again used to subject the substrate to surface treatment at 30° C. for 60 seconds so that a zincate layer was formed.

Then, diethylene glycol, propylene glycol, adipic acid, itaconic acid and fumaric acid were polycondensed at molar ratios of 0.45/0.05/0.20/0.15/0.15 in a nitrogen atmosphere at a reaction temperature of 195° C., a reaction period of time of 5 hours under a reduced pressure. Thus, 100 parts of the thus obtained unsaturated polyester resin having a number average molecular weight of 1700 was added with 15 parts of pentaerythritol trimethacrylate, 3 parts of diethylene glycol dimethacrylate, 7.5 parts of tetraethylene glycol dimethacrylate, 4 parts of 2-hydroxyethylmethacrylate, 3.6 part of phosphomono (methacryloyloxyethyl), 2 parts of 2,2-dimethoxy-2-phenylacetophenone, 0.04 part of 2,6-di-tert-challis-butyl-4-methylphenol and 0.2 part of Oil Yellow 3G manufactured by Orient Chemical. The solution was sufficiently stirred and mixed so that a photosensitive resin composition was obtained. The prepared photosensitive resin composition was applied to the processed aluminum substrate by using an apparatus SR-B manufactured by Asahi Kasei to have a thickness of 37 μm. Then, exposure was performed by using a parallel-beam light source manufactured by Oak through a glass mask corresponding to a wiring pattern including a pattern having a minimum wiring pitch of 26 μm, and the development (1% borate soda, 40° C. and a discharge pressure of 0.1 kg/cm$^2$) performed. Thus, a resin pattern having a width of 5 μm to 10 μm and a height of 32 μm was formed on the processed aluminum substrate.

The aluminum substrate having the resin pattern formed thereon was injected into plating solution which was copper pyrophosphate plating solution manufactured by Murata while voltage was applied. Under condition that the current density on the cathode was 3A/dm$^2$, a plated copper film having a thickness of 30 μm was deposited so that a pattern conductor was formed. Concentrated sulphuric acid was used to remove the resin pattern, and then thermally adhered to a polyimide sheet manufactured by Dupont and having a thickness of 25 μm by using an adhesive sheet. Then, the aluminum substrate was removed by etching using 10% hydrochloric acid. Thus, a thick-film conductor circuit including a portion in which the minimum wiring pitch was 26 μm was obtained. The obtained thick-film conductor circuit enables dense wiring, the minimum wiring pitch of which was 50 μm or shorter, to be performed. When the attenuation factor of a signal before and after passage of the thick-film conductor circuit was measured by using a pulse generator (TM502A manufactured by Techtronics). Since the resistance of the wiring was low, the attenuation factor of the signal was significantly small. Thus, employment of the foregoing conductor circuit as a different-pitch wiring element was permitted.

EXAMPLE 6

Diethylene glycol, propylene glycol, adipic acid, fumaric acid, itaconic acid and isophthalid acid were polycondensed at molar ratios of 0.4/0.1/0.22/0.12/0.12/0.04 in a nitrogen atmosphere at a reaction temperature of 200° C., a reaction period of time of 4 hours under a reduced pressure so that unsaturated polyester prepolymer having a number average molecular weight of 1500 was prepared.

Then, 12 parts of tetraethylene glycol dimethacrylate, 5 parts of diethylene glycol dimethacrylate, 8 parts of 2-hydroxyethylmethacrylate, 12 parts of pentaerythritol methacrylate, 3 parts of pentaerythritol tetramethacrylate, 5 parts of phosphomono (methacryloyloxyethyl), 2 parts of 2,2-dimethoxy-2-phenylacetophenone and 0.05 part of 4-tertchallis-butyl catechol each of which served light polymerization initiators, and 0.15 part of Kayaset Red A-2G manufactured by Nihon Kayaku were added to 100 parts by weight of the prepolymer. The solution was sufficiently stirred and mixed so that a photosensitive resin composition was obtained.

2,2-dimethoxy-2-phenylacetophenone had a molar absorbance coefficient of 181 1/mol·cm (336 in ethanol. The molar absorbance coefficient was measured in a wavelength range of 300 nm to 420 in which an optical system, such as a glass element, does not absorb light and which is effective to start reaction and in which the light polymerization initiator had an absorption peak. The foregoing photosensitive resin composition having a thickness of 100 μm had a light transmittance of 24% at the above-mentioned wavelength.

Then, the above-mentioned photosensitive resin composition was applied to the aluminum substrate processed similarly to Example 1 to have a thickness of 100 μm. A photomask corresponding to a wiring density of 25 lines/mm (a wiring pitch of 40 μm) was used to form a resin pattern by a method similar to that employed in Example 3. Then, the substrate having the resin pattern formed thereon was electrolytically plated with copper by a method similar to that employed in Example 3. Then, the aluminum plate was removed by etching using 10% hydrochloric acid so that a thick-film conductor circuit board having a wiring density of 25 lines/nm and incorporating a conductor having a thickness of 100 μm was obtained.

COMPARATIVE EXAMPLE 4

A photosensitive resin composition was prepared similarly to Example 6 except for 1 part of 2-methylanthraquinone in place of 2 parts of 2,2-dimethoxy-2-phenylacetophenon according to Example 6. 2-methylanthraquinone had a molar absorbance coefficient of 3800 1/mol·cm (326 nm). The foregoing photosensitive resin composition, the thickness of which was 100 μm, had a light transmittance of 1.8%.

Then, the foregoing photosensitive resin composition was subjected to a pattern forming process by a method similar to that of Example 6. However, light could not reach the aluminum substrate and the resin pattern was not left on the aluminum substrate. When the period of time for which ultraviolet rays were applied was multiplied to five times to cause light to reach the aluminum substrate, also resin in the non-exposed portion was undesirably hardened. Thus, forming of a conductor by plating was not permitted.

EXAMPLE 7

An aluminum substrate manufactured by Toyo Aluminum and having a thickness of 100 μm was subjected to surface treatment at 40° C. for 60 seconds by using SUB-STAR ZN2 manufactured by Okuno. Then, 15 nitric acid was used to etch the aluminum substrate at 30° C. for 60 seconds. Then, SUB-START ZN2 was again used to subject the substrate to surface treatment at 30° C. for 60 seconds so that a zincate layer was formed.

Then, diethylene glycol, propylene glycol, adipic acid, itaconic acid and fumaric acid were polycondensed at molar ratios of 0.45/0.05/0.20/0.15/0.15. Thus, unsaturated polyester resin having a number average molecular weight of 1700 was obtained. Then, 100 parts by weight of the polyester resin was added with 15 parts of trimethylolpropane trimethacrylate, 4 parts of bisphenol A-di-(ethyloxymethacrylate), 7.5 parts of tetraethylene glycol dimethacrylate, 4 parts of 2-hydroxyethylmethacrylatee 3.6 parts of phosphomono (methacryloyloxyethyl), 1 part of benzoin isobutylether, 0.04 part of 2,6-di tert-challis-butyl-4-methylphenol and 0.014 part of OPLAS Yellow 130 serving as a photoabsorber and manufactured by Orient. The solution was sufficiently stirred and mixed so that photosensitive resin composition C was obtained.

A process similar to that for preparing the photosensitive resin composition C was performed except for 2 parts of 2,2-dimethoxy-2-phenylacetophenone being employed in place of 1 part of benzoin butylether of the photosensitive resin composition C and 0.05 part of Oil Yellow 3G manufactured by orient in place of OPLAS Yellow 130 manufactured by orient so that photosensitive resin composition D was obtained.

The light transmittance of the photosensitive resin composition C at 365 was measured by using a spectropotometer U-3210 manufactured by Hitachi. As a result, the light transmittance was 30% when the film thickness was 350 μm and 71% when the film thickness was 100 μm. Similarly, the photosensitive resin composition D had a light transmittance of 26% when the film thickness was 50 μm and 59% when the film thickness was 20 μm.

The prepared photosensitive resin composition was applied to the surface of the processed aluminum substrate by using an apparatus SR-B manufactured by Asahi Kasei. At this time, the thickness of the resist layer was adjusted as shown in Table 2 by using a spacer. A predetermined glass mask and a parallel-beam light source manufactured by Oak were used to form a resin pattern having a width of 6 μm to 40 μm and a predetermined height on the aluminum substrate by a method similar to that employed in Example 3.

A pattern conductor was formed on the obtained resin pattern by using copper pyrophosphate plating solution manufactured by Murata after the substrate was injected in a state where voltage was applied. Under a condition that the current density at the cathode was 3A/dm² so that a plate copper film having the thickness as shown in Table 2 was deposited. A bond (Cemedine EP008 or EP170) was screen-printed to the surface of the obtained substrate, and then transcribed and bonded to the surface of an epoxy glass insulating substrate. Then, the aluminum substrate was removed by etching using 10% hydrochloric acid so that a thick-film pattern conductor was obtained.

The obtained substrate was cut to 2 cm×2 cm pieces which were then hardened with epoxy resin. Then, the cross section was mirror-polished with a polishing machine so that the pattern shape was observed and resistance values per unit length were measured. Results were shown in Table 2.

TABLE 2

| Sample No. | Composition | Minimum Wiring Pitch (μm) | Thickness of Resin (μm) | Width of Conductor (μm) | Height of Conductor (μm) | Resistance of Conductor (Ω/cm) |
|---|---|---|---|---|---|---|
| 1 | C | 95 | 350 | 55 | 335 | 0.01 |
| 2 | C | 50 | 100 | 30 | 95 | 0.06 |
| 3 | D | 28 | 50 | 15 | 50 | 0.24 |
| 4 | D | 14 | 20 | 8 | 18 | 1.3 |

As can be understood from Table 2, the thick-film pattern conductor obtainable from the present invention enables dense wiring, the wiring pitch of which is shorter that 100 μm, in particular shorter that 50 μm, to be formed. Moreover, a resistance value per centimeter is significantly low.

EXAMPLE 8

A photosensitive resin composition was prepared by a method similar to that for preparing the photosensitive resin composition C according to Example 7 except for photoabsorbers and densities shown in Table 3. The light transmittance when the thickness was 80 μm at 365 nm was measured.

TABLE 3

| Sample No. | Type of Photoabsorber | Density (wt %) | Transmittance When Thickness was 80 μm (365 nm) |
|---|---|---|---|
| 5 | Not Used | 0% | 83% |
| 6 | Oil Yellow 3G (manufactured by Orient) | 0.15% | 12% |
| 7 | Kayaset Red A-2G (manufactured by Nihon Kayaku) | 0.1% | 31% |
| 8 | OPLAS Yellow 130 (manufactured by Orient) | 0.05% | 33% |

Then, a method similar to that employed in Example 6 was employed and the prepared photosensitive resin composition was used to form a resist pattern having a pitch of 40 μm (25 lines/mm) and a height of 80 μm. Copper pyrophosphate plating solution manufactured by Murata was used such that the substrate was injected while a voltage was applied. Then, a plated copper film having a thickness was deposited under a condition that the current density at the cathode under a condition that the current density at the cathode was 3A/dm². Thus, a thick-film conductor circuit was formed.

A bond (Cemedine EP008 or EP170) was screen-printed to the surface of the obtained substrate, and then transcribed and bonded to the surface of a glass substrate. Then, the aluminum substrate was removed by etching with 10% hydrochloric acid. Thus, a thick-film pattern conductor was obtained. Shapes and resistance values of the obtained conductors were shown in Table 4.

TABLE 4

| Sample No. | Measured Height of Conductor (μm) | Resistance of Conductor (Ω/cm) |
| --- | --- | --- |
| 5 | 77 | Disconnected |
| 6 | 81 | Short Circuit |
| 7 | 80 | 0.07 |
| 8 | 82 | 0.07 |

Sample Nos. 5 and 6 are not included in the scope of the present invention and they are comparative examples. When the light transmittance of the photosensitive resin composition is 75% or higher or when the same is 15% or lower, dense wiring having a wiring pitch shorter than 50 μm cannot easily be performed. If the light transmittance is 75% or higher, a portion of the conductor is not deposited because of fogging occurring when exposure or development is performed. Thus, disconnection easily takes place. If the light transmittance is 15% or lower, the resist cannot sufficiently be hardened. Therefore, the resist pattern is sometimes separated when development is performed or plated copper is undesirably introduced between the resist and the substrate when the plating process is performed. In this case, short circuit between conductors easily occurs.

On the other hand, sample Nos. 7 and 8 enable dense wiring having the wiring pitch shorter that 50 μm to be realized. Moreover, a resistance value of 0.1 Ω or lower par unit length was observed.

EXAMPLE 9

An aluminum substrate manufacture by Toyo Aluminum and having a thickness of 100 μm was subjected to surface treatment of 30° C. for 80 seconds by using AZ401 zincate processing solution manufactured by Uemura. The surface diffusion reflectance of the obtained aluminum substrate at 365 nm was measure by a spectrophotometer MPS-2000 manufactured by Simazu, resulting in 18%. Then, deithylene, glycol, propylene glycol, adipic acid, isophthalic acid, fumaric acid and itaconic acid were condensed at molar ratios of 0.38/0.12/0.2/0.05/0.14/0.11. Thus, unsaturated polyester prepolymer having a number average molecular weight of 1830 was obtained. Then, 100 parts by weight of the unsaturated polyester prepolymer were added with 14 parts of pentaerythritol trimethacrylate, 4.5 parts of diethylene glycol dimethacrylate, 10.5 parts of tetraethylene glycol dimethacrylate, 2 parts of 2, 2-dimethoxy-2-phenylacetophenone, 0.04 part of 2, 6-di-tert-challis-butyl-4-methylphenol and 0.2 parts of OPLAS Yellow 140 manufactured by Orient. Then, the solution was sufficiently stirred and mixed so that a photosensitive resin composition was obtained. The prepared photosensitive resin composition was applied to the processed aluminum substrate by using an apparatus SR-B manufactured by Asahi Kasei. At this time, the thickness of the resist film was adjusted to be a predetermined value by using a spacer. Then, exposure was performed by using a parallel-beam light source manufactured by Oak through a predetermined glass mask, and the development (1% sodium borate, 40° C. and a discharge pressure of 0.1 kg/cm²) was performed. Thus, a resin pattern having a width of 4 μm to 35 μm and a height of 10 μm or larger was formed on the processed aluminum substrate.

The aluminum substrate having the resin pattern formed thereon was injected into plating solution which was copper pyrophosphate plating solution manufactured by Murata while voltage was applied. Under condition that the current density on the cathode was 3A/dm², a plated copper film having a thickness as shown in Table 4 was deposited so that a pattern conductor was formed. A bond (Cemedine EP008 or EP170) was screen-printed to the surface of the obtained substrate, and then transcribed and boded to the surface of an epoxy glass insulating substrate. Then, the aluminum substrate was removed by etching using 10% hydrochloric acid. Thus, a thick-film conductor circuit was obtained.

The obtained substrate was cut into 2 cm—2 cm pieces, and then embedded and hardened with epoxy resin. Then, the cross section of the piece was mirror-polished with a polishing machine so that the shape of the pattern was observed. Moreover, a resistance value per unit length was measured. Results were shown in Table 5.

TABLE 5

| Sample No. | Minimum Wiring Pitch (μm) | Width of Conductor (μm) | Height of Conductor (μm) | Resistance of Conductor (Ω/cm) |
| --- | --- | --- | --- | --- |
| 9 | 20 | 10 | 15 | 1.2 |
| 10 | 30 | 10 | 30 | 0.59 |
| 11 | 45 | 10 | 50 | 0.35 |
| 12 | 10 | 6 | 8 | 3.7 |

As can be understood from Table 5, the thick-film conductor circuit according to the present invention enables dense wiring having a minimum wiring pitch of 50 μm or shorter to be realized. Moreover, a resistance value per centimeter is significantly low. Moreover, when the attenuation factor of a signal before and after passage of sample No. 10 was measured by using a pulse generator (TM502A manufactured by Techtronics). Since the resistance of the wiring was low, the attenuation factor of the signal was significantly small. Thus, transmission of the signal was permitted.

EXAMPLE 10

An aluminum substrate manufactured by Toyo Aluminum and having a thickness of 100 μm was subjected to various surface treatment processes shown in Tables 6 and 7. A method similar to that employed in Example 9 was employed to measure the diffusion reflectance of the surface of the substrate was measured.

TABLE 6

| Processing Method | Processing Condition |
| --- | --- |
| Buff Roll Polishing | BUFF Manufactured by 3M HD Flap S-SF #600 Number of Revolutions of Wheel 220 rpm Oscillation 480 times/minute |
| Sand Blast Polishing | Sand Six Scrandom R #220 (Alumina Type) Jet Water Pressure 2 kg/cm² |
| Hot Water Process | Ion Exchanged water 85° C. 10 minutes |
| MBV Method | Sodium Carbonate/Chromic Acid (10/3 w/w) 65 g/l 90° C. 20 minutes |
| Permanganate Method | Permanganate 5 g/l copper nitrate 20 g/l 80° C. 5 minutes |
| Zincate Method 1 | AZ-401 Processing Solution Manufactured by Uemura 30° C. 80 seconds |
| Zincate Method 2 | SUBSTAR-ZN-2 Processing Solution Manufactured by |

TABLE 6-continued

| Processing Method | Processing Condition |
|---|---|
| | Okuno |
| | ZN-2 30° C. 60 seconds |
| | 15% Nitric Acid 30° C. |
| | 60 seconds |
| | ZN-2 30° C. 60 seconds |

TABLE 7

| Sample No. | Processing Method | Diffusion Reflectance (365 nm) |
|---|---|---|
| 13 | Buff Roll Polishing | 35% |
| 14 | Sand Blast Polishing | 72% |
| 15 | Buff Roll Polishing + Zincate Process | 13% |
| 16 | Buff Roll Polishing + Hot Water Process | 16% |
| 17 | MBV Process | 17% |
| 18 | Permanganate Process | 4% |

Then, a prepared photosensitive resin composition, the exposing apparatus and developing apparatus similar to those in Example 9 were used so that a resin pattern having a pitch of 25 μm, a width of 10 μm and a height of 30 μm was formed. Then, copper pyrophosphate plating solution manufactured by Murata was used such that the substrate was injected while a voltage was applied. Then, a plated copper film having a thickness of 30 μM was deposited under a condition that the current density at the cathode was $3A/dm^2$. Thus, a pattern conductor was formed.

A bond (Cemedine EP008 or EP170) was screen-printed to the surface of the obtained substrate, and then transcribed and boded to the surface of a glass substrate. Then, the aluminum substrate was removed by etching using 10% hydrochloric acid. Thus, a thick-film conductor circuit was obtained. Measured heights and resistance values of the obtained conductors were shown in Table 8.

TABLE 8

| Sample No. | Measured Height of Conductor (μm) | Resistance of Conductor (Ω/cm) |
|---|---|---|
| 13 | 28 | Disconnected |
| 14 | 30 | Disconnected |
| 15 | 31 | 0.38 |
| 16 | 30 | 0.39 |
| 17 | 26 | 0.45 |
| 18 | 28 | 0.42 |

Sample Nos. 13 and 14 in the Table 8 are not included in the scope of the present invention. When the diffusion reflectance of the surface of the aluminum substrate is 20% or higher, dense wiring having a minimum wiring pitch of 50 μm or shorter cannot easily be realized. A fogging phenomenon occurring when an exposing process or a development process is performed results in inhibition of a portion of the plated conductor from deposition. Thus, disconnection easily occurs.

On the other hand, any one of the substrates according to sample Nos. 15, 16, 17 and 18 enabled dense wiring having a minimum wiring pitch of 50 μm or shorter to be realized.

EXAMPLE 11

A copper plated film having a thickness of about 6 μm was formed on the surface of an aluminum substrate manufactured by Toyo Aluminum and having a thickness of 100 μm by using copper pyrophosphate plating solution manufactured by Murata under a condition that the current density at the cathode was $3A/dm^2$. The substrate was polished with a buff roll under the condition for Sample No. 1 in Example 10. Then, Electrobrite #499 manufactured by Ebara was used to perform a surface blackening process at 85° C. for one minute. The diffusion reflectance of the surface of the obtained copper substrate was 3%.

A photosensitive resin composition was applied to the foregoing substrate by a method similar to that according to Example 10. Then, exposure, development and plating were performed through a photomask so that a conductor circuit substrate was obtained. The obtained substrate and a polyimide substrate with a bond manufactured by Dupont were thermally adhered. Then, the aluminum substrate was removed by etching using 10% hydrochloric acid. Then, a copper foil portion was removed by etching using 25% ferric chloride solution.

The cross sectional shape and resistance of the pattern conductor were measured. As a result, a thick-film conductor circuit which could be used as a different-pitch wiring element having a minimum wiring pitch of 15 μm and incorporating a conductor having a width of 7 μm and a height of 22 μm was manufactured.

EXAMPLE 12

An aluminum substrate processed similarly to Example 1, a photosensitive resin composition adjusted by a method employed in Example 3 and a predetermined glass mask were used so that a coil-shape resist pattern was formed on the aluminum thickness of the resist layer was 100 μm, the wiring pitch was 65 μm, the width of the resist was 15μm, the height of the resist was 100 μm and the number of windings was 24.

The coil-shape pattern include two types, right-side type and a reverse-side type each having a diameter of 15 φ. Each of the coil-shape pattern incorporates a plurality of similar shape spiral coils disposed in the inner periphery at the same angular intervals; a terminal for establishing the connection with outside; wiring lines for connecting the coils and between the coil and the terminal; and a through hole land for establishing the connection between the right side and the reverse side.

A conductor was formed in the foregoing resist pattern by using copper pyrophosphate plating solution manufactured by Uemura such that the substrate was injected while a voltage was applied to deposit a plated copper film having a thickness of 100 μm under a condition that the current density at the cathode was $4A/dm^2$.

A bond (Cemedine EP008 or EP170) was screen-printed to the surface of the obtained substrate. Then, a glass fiber cloth (106/AS/307) manufactured by Asahi was interposed, and then the right side and the reverse side were aligned. Then, transcription and adhesion were performed, and then the aluminum substrate was removed by etching using 10% hydrochloric acid. Then, the surface of the joined substrates was polished by using a buff roll polishing machine by about 4 μM so that the surface was flattened. Then, a solder resist USR-11G manufactured by Tamura was used to perform coating a film having a thickness of 30 μm by the screen printing method. Then, ultraviolet rays were applied so that hardening was performed. Then, a hole having a diameter of 0.46 mm was formed in the through hole portion by using a drill. Then, cream solder was injected, and a reflow furnace was used to open the through hole.

The obtained flat coil was cut into 2 cm×2 cm pieces, and then epoxy resin was used to hardened the pieces. Then, a polishing machine was operated to mirror-surface-polish the cross section. The coil conductor portion was observed by an optical microscope. As a result, the width of the conductor was 50 μm, the height of the same was 100 μm, dispersion in the thickness in the widthwise direction was ±3% of the average value, and the distance between conductors was 15 μm. The overall shape was in a rectangular shape. The conductor and the insulating layer (a liquid photosensitive resin composition) between conductors were positioned on the same plane.

The insulation resistance between terminal in the different phases of the obtained flat coil was $4 \times 10^5$ MΩ or higher and dielectric breakdown voltage was 1 kV or higher. Thus satisfactory results were obtained. The ratio of change in the inductance and resistance after the sample was allowed to stand for 1000 hours in an environment in which the temperature was 85° C. and the humidity was 90% was ±2% or lower, which was a very low ratio. Even after the sample was allowed to stand for 100 hours in an environment in which the temperature was 85° C. and the humidity was 90% under a voltage of 24 V DC, copper was not deposited from the surface of the conductor and no corrosion was observed. An impact test was performed such that a 100 g steel ball was dropped from a height of 1 m. As a result, the inductance and the resistance value were maintained. Thus, prevention of short circuit was confirmed.

COMPARATIVE EXAMPLE 5

Negative type resist "Microresist 747-110 cst" manufactured by Kodak was applied to the surface of an aluminum substrate having a thickness of 100 μm to realize a dry thickness of 5 μm. Then, pre-baking was performed, and a coil pattern mask was used to perform exposure, development and post-baking. In the resist pattern formed on the aluminum substrate, a conductor was formed by using copper pyrophosphate plating solution manufactured by Uemura to deposit a plated copper film having a thickness of 50 μm under a condition that the current density at the cathode was 4A/dm$^2$. A method similar to the example was employed so that transcription and adhesion were performed. Then, etching of the aluminum portion and the opening of the through hole were performed. Then, the copper pyrophosphate plating solution manufactured by Uemura was again used to form a plated copper film having a thickness of 50 μm under a condition that the current density at the cathode was 5A/dm$^2$. Then, a protective layer was formed similarly to Example 12 so that a flat coil was formed.

When the cross section of the obtained flat coil was observed, the conductor was in the form of a spherical shape formed by semispheric conductors vertically connected to each other. The radius of the conductor was about 50 μm and the distance between the conductors was 15 μm.

The insulation resistance between terminals of the flat coil between different phase was $2 \times 10^5$ MΩ or higher, and the dielectric breakdown voltage was 0.9 kV or higher. Thus, relatively satisfactory results were obtained. In an environment that the temperature was 85° C. and the humidity was 90% under application of 24 V DC for 100 hours, the inductance and resistance were reduced by about 20% and about 12%, respectively. Thus, occurrence of a short circuit between the conductors during the test was confirmed. When the impact test which was the same as that carried out in Example 12 was performed, 28 coils of 100 coils encountered reduction in the inductance and the resistance value by 20% or more. Thus, short circuit between conductors and disconnection owning to the impact were observed.

Industrial Applicability

The thick-film conductor circuit according to the present invention has excellent oxidation resistance and corrosion resistance. Moreover, occurrence of a defect, such as deterioration in the insulating characteristic and occurrence of short circuit owning to migration of elements forming the conductor, can significantly be prevented. Since a high wiring density can be realized and resistance can freely be determined, the thick-film conductor circuit according to the present invention is able to realize very high density and low-resistance wiring. Moreover, the thick-film conductor circuit can easily be manufactured at a low cost.

What is claimed is:

1. A method of manufacturing a thick-film conductor circuit comprising the steps of: employing a conductive substrate which is an aluminum plate processed with basic solution containing zinc; coating the surface of the conductive substrate with a liquid photosensitive resin composition; exposing a portion, in which a resin pattern must be formed, to a high-energy beam; dissolving or dispersion-removing a non-exposed portion of the photosensitive resin composition with developing solution so that a required resin pattern is formed on the conductive substrate; immersing the conductive substrate in plating solution while voltage is applied so that a conductor is formed by electrolytic plating; and removing the conductive substrate.

2. A method of manufacturing a thick-film conductor circuit comprising the steps of: coating the surface of a conductive substrate with a liquid photosensitive resin composition; exposing a portion, in which a resin pattern must be formed, to a high-energy bean; dissolving or dispersion-removing a non-exposed portion of the photosensitive resin composition with developing solution so that a required resin pattern is formed on the conductive substrate; forming a conductor by electrolytic plating; and removing the conductive substrate, wherein the liquid photosensitive resin composition contains prepolymer having an ethylene unsaturated group, polymerizable monomer, a light polymerization initiator and a photoabsorber, the prepolymer is unsaturated polyester resin which is obtainable from condensation of a dicarboxylic acid component and a diol component and which has a number average molecular weight of 500 to 5,000, the dicarboxylic acid component contains compound (a) having a component expressed by the following chemical formula (1) at a molar ratio of 0.1 to 0.4 and compound (b) having a component expressed by the following chemical formula (2) at a molar ratio of 0.1 to 0.4 when the overall molar ration of the dicarboxylic acid component is 1:

chemical formula (1)

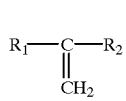

-continued chemical formula (2)

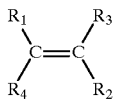

where $R_1$ and $R_2$ are each —COOH or —CH$_2$COOH and $R_3$ and $R_4$ are each —H or —CH$_3$, the polymerizable monomer component contains at least one type of a compound which has at least there aclyloyl groups or methacryoyl groups in one molecule thereof and which is combined with carbon atoms to which the aclyloyl group or the methacryoyl group is combined such that fifteen or less carbon atoms and/or oxygen atoms exist in such a manner that the compound is contained by 1 part by weight to 3 parts by weight with respect to 100 parts by weight of the prepolymer, a light polymerization initiator having a molar absorbance coefficient of 5 l/mol·cm to 1000 l/mol·cm is contained in a quantity of 0.01 wt % to 10 wt % and a photoabsorber in a quantity of 0.01 wt % to 7 wt %, and the light transmittance is 15% to 75%.

3. A method of manufacturing a thick-film conductor circuit according to claim 2, wherein the conductive substrate is an aluminum plate processed with basis solution containing zinc.

4. A method of manufacturing in thick-film conductor circuit according to claim 3, wherein 75 mol % or more of components except for the components expressed by chemical formula (1) and chemical formula (2) is dicarboxylic acid component expressed by the following chemical formula (3):

HOOC—(CH$_2$)$_n$—COOH (n=3 to 8 ) chemical formula 3.

5. A method of manufacturing a thick-film conductor circuit according to claim 3, wherein the surface diffusion reflectance of the conductive substrate in a photosensitive wavelength region of the liquid photosensitive resin is 20% or lower.

6. A method of manufacturing a thick-film conductor circuit according to claim 2, wherein the surface diffusion reflectance of the conductive substrate in a photosensitive wavelength region of the liquid photosensitive resin is 20% or lower.

7. A thick-film conductor circuit comprising: a zinc-contained layer which is formed in a region of a depth of 5 μm from a surface of a conductor composed of copper and which contains zinc atoms at a ratio of 3 atom % to 20 atom % with respect to copper atoms, wherein a thickness of said zinc-contained layer is 0.1 μm to 5 μm, said conductor having a rectangular widthwise directional cross sectional shape, and rounded corners for two lower ends of said conductor, wherein an insulation lithography between conductors is a hardened material of the photosensitive resin composition made by the method as claimed in claim 2.

8. A method of manufacturing a thick-film conductor circuit according to claim 2, wherein 75mol % or more of components except for the components expressed by chemical formula (1) and chemical formula (2) is dicarboxylic acid component expressed by the following chemical formula (3):

HOOC—(CH$_2$)$_n$—COOH (n=3 to 8) chemical formula 3.

9. A thick-film conductor circuit comprising a conductor which has a rectangular widthwise directional cross sectional shape, wherein rounded corners are provided for two lower ends of said conductor, and wherein an insulating lithography between conductors is a hardened material of the photosensitive resin composition made by the method as claimed in claim 2.

10. A thick-film conductor circuit according to claim 9 or 7, wherein said conductor has a portion in which a minimum wiring pitch is 100 μm or shorter, the aspect ratio of said conductor is 1.2 or higher and the height of said conductor is 20 μm or larger.

* * * * *

UNITED STATES PATENT AND TRADEMARK OFFICE
CERTIFICATE OF CORRECTION

PATENT NO. : 6,271,589 B1
DATED : August 7, 2002
INVENTOR(S) : Kozo Yoshida et al.

It is certified that error appears in the above-identified patent and that said Letters Patent is hereby corrected as shown below:

Column 30,
Line 39, "bean" should read -- beam --.

Column 31,
Line 12, "there aclyloyl" should read -- three acryloyl --.
Line 12, "methacryoyl" should read -- methacryloyl --.
Line 22, "0.01" should read -- 0.1 --.
Line 23, "7" should read -- 1 --.
Line 27, "basis" should read -- basic --.
Line 29, "in" should read -- a --.

Column 32,
Line 19, "75mol" should read -- 75 mol --.

Signed and Sealed this

Eleventh Day of February, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,271,589 B1
DATED : August 7, 2001
INVENTOR(S) : Kozo Yoshida et al.

It is certified that error appears in the above-identified patent and that said Letters Patent is hereby corrected as shown below:

Column 30,
Line 39, "bean" should read -- beam --.

Column 31,
Line 12, "there aclyloyl" should read -- three acryloyl --.
Line 12, "methacryoyl" should read -- methacryloyl --.
Line 22, "0.01" should read -- 0.1 --.
Line 23, "7" should read -- 1 --.
Line 27, "basis" should read -- basic --.
Line 29, "in" should read -- a --.

Column 32,
Line 19, "75mol" should read -- 75 mol --.

This certificate supersedes Certificate of Correction issued February 11, 2003.

Signed and Sealed this

Fifteenth Day of April, 2003

JAMES E. ROGAN
*Director of the United States Patent and Trademark Office*